US011088161B2

(12) United States Patent
Kim et al.

(10) Patent No.: US 11,088,161 B2
(45) Date of Patent: Aug. 10, 2021

(54) THREE-DIMENSIONAL SEMICONDUCTOR MEMORY DEVICE AND METHOD OF DETECTING ELECTRICAL FAILURE THEREOF

(71) Applicant: Samsung Electronics Co., Ltd., Suwon-si (KR)

(72) Inventors: Taeyoung Kim, Seoul (KR); Moorym Choi, Yongin-si (KR); Dongchan Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 161 days.

(21) Appl. No.: 16/036,000

(22) Filed: Jul. 16, 2018

(65) Prior Publication Data

US 2019/0139980 A1 May 9, 2019

(30) Foreign Application Priority Data

Nov. 9, 2017 (KR) .................. 10-2017-0148952

(51) Int. Cl.
| | |
|---|---|
| *H01L 27/11582* | (2017.01) |
| *H01L 27/1157* | (2017.01) |
| *G11C 16/34* | (2006.01) |
| *G11C 16/04* | (2006.01) |
| *H01L 23/532* | (2006.01) |

(Continued)

(52) U.S. Cl.
CPC .... *H01L 27/11582* (2013.01); *G11C 11/5621* (2013.01); *G11C 16/0483* (2013.01); *G11C 16/3431* (2013.01); *G11C 29/04* (2013.01); *G11C 29/50004* (2013.01); *H01L 23/5329* (2013.01); *H01L 27/108* (2013.01); *H01L 27/1157* (2013.01); *G11C 2029/5004* (2013.01)

(58) Field of Classification Search
None
See application file for complete search history.

(56) References Cited

U.S. PATENT DOCUMENTS

| | | |
|---|---|---|
| 9,224,495 B2 | 12/2015 | Jung et al. |
| 9,378,692 B2 | 6/2016 | Chen et al. |

(Continued)

FOREIGN PATENT DOCUMENTS

| | | |
|---|---|---|
| KR | 10-2015-0050019 A | 5/2015 |
| KR | 10-1521732 B1 | 5/2015 |

(Continued)

*Primary Examiner* — Steven B Gauthier
*Assistant Examiner* — Christopher A Culbert
(74) *Attorney, Agent, or Firm* — Muir Patent Law, PLLC

(57) ABSTRACT

Disclosed are three-dimensional semiconductor memory devices and methods of detecting electrical failure thereof. The three-dimensional semiconductor memory device includes a substrate with a first conductivity including a cell array region and an extension region having different threshold voltages from each other, a stack structure on the substrate and including stacked electrodes, an electrical vertical channel penetrating the stack structure on the cell array region, and a dummy vertical channel penetrating the stack structure on the extension region. The substrate comprises a pocket well having the first conductivity and provided with the stack structure thereon, and a deep well surrounding the pocket well and having a second conductivity opposite to the first conductivity.

18 Claims, 36 Drawing Sheets

(51) Int. Cl.
    *H01L 27/108*     (2006.01)
    *G11C 29/50*     (2006.01)
    *G11C 29/04*     (2006.01)
    *G11C 11/56*     (2006.01)

(56) References Cited

U.S. PATENT DOCUMENTS

| | | |
|---|---|---|
| 9,666,289 B2 | 5/2017 | Lee et al. |
| 9,716,104 B2 | 7/2017 | Kim et al. |
| 9,824,759 B2 | 11/2017 | Kwon et al. |
| 9,859,297 B2 | 1/2018 | Park et al. |
| 2012/0003800 A1* | 1/2012 | Lee .................. H01L 27/11578 |
| | | 438/261 |
| 2013/0007353 A1* | 1/2013 | Shim ...................... G11C 16/14 |
| | | 711/103 |
| 2016/0268287 A1* | 9/2016 | Park .................. H01L 27/11575 |
| 2016/0307632 A1* | 10/2016 | Lee ..................... H01L 23/5286 |
| 2017/0170191 A1 | 6/2017 | Lee et al. |

FOREIGN PATENT DOCUMENTS

| | | |
|---|---|---|
| KR | 10-2016-0109988 A | 9/2016 |
| KR | 10-2016-0124294 A | 10/2016 |
| KR | 10-2017-0018207 A | 2/2017 |
| KR | 10-2017-0070355 A | 6/2017 |

\* cited by examiner

THREE-DIMENSIONAL SEMICONDUCTOR MEMORY DEVICE AND METHOD OF DETECTING ELECTRICAL FAILURE THEREOF

CROSS-REFERENCE TO RELATED APPLICATIONS

This U.S. non-provisional patent application claims the benefit of priority under 35 U.S.C. § 119 of Korean Patent Application No. 10-2017-0148952, filed on Nov. 9, 2017, in the Korean Intellectual Property Office, the entire contents of which are hereby incorporated by reference.

BACKGROUND

Inventive concepts relate to a semiconductor, and more particularly, to a three-dimensional semiconductor memory device and a method of detecting an electrical failure thereof.

Semiconductor devices have been highly integrated for satisfying high performance and low manufacturing costs of semiconductor devices which are desired by customers. Since integration of the semiconductor devices is an important factor in determining product price, highly-integrated semiconductor devices are increasingly demanded. Integration of typical two-dimensional or planar semiconductor memory devices is primarily determined by the area occupied by a unit memory cell, such that it is greatly influenced by the level of technology for forming fine patterns. However, the extremely expensive processing equipment needed to increase pattern fineness sets a practical limitation on increasing the integration of two-dimensional semiconductor memory devices. Therefore, there have been proposed three-dimensional semiconductor memory devices having three-dimensionally arranged memory cells.

SUMMARY

Some embodiments provide a three-dimensional semiconductor memory device capable of determining whether or not an electrical failure occurs, and a method of detecting an electrical failure thereof.

Some embodiments provide a three-dimensional semiconductor memory device capable of easily determining whether or not an electrical failure occurs for each of a cell array region and an extension region, and a method of detecting an electrical failure thereof.

Some embodiments provide a three-dimensional semiconductor memory device capable of determining where leakage current occurs by applying a discrimination voltage between threshold voltages of the cell array region and the extension region, and a method of detecting an electrical failure thereof.

According to exemplary embodiments, a three-dimensional semiconductor memory device may include a substrate having a first conductivity and having a cell array region and an extension region, the cell array region including transistors having a first threshold voltage and the extension region including transistors having a second threshold voltage different from the first threshold voltage; a stack structure on the substrate, the stack structure including stacked electrodes; an electrical vertical channel penetrating the stack structure on the cell array region; and a dummy vertical channel penetrating the stack structure on the extension region. The substrate may comprise: a pocket well having the first conductivity and provided with the stack structure thereon; and a deep well surrounding the pocket well and having a second conductivity opposite to the first conductivity.

According to exemplary embodiments, a three-dimensional semiconductor memory device may include a semiconductor substrate having a first conductivity and having an extension region including transistors having a first threshold voltage and a cell array region including transistors having a second threshold voltage greater than the first threshold voltage; a stack structure including a plurality of electrodes stacked on the semiconductor substrate and having a stepwise structure on the extension region; and a plurality of vertical channels penetrating the stack structure. The plurality of vertical channels may comprise: an electrical vertical channel on the cell array region; and a dummy vertical channel on the extension region and penetrating the stepwise structure. The semiconductor substrate may comprise: a pocket well having the first conductivity and being connected to the electrical and dummy vertical channels; and a deep well surrounding the pocket well and having a second conductivity opposite to the first conductivity.

According to exemplary embodiments, a method of detecting an electrical failure of a three-dimensional semiconductor memory device including a stack structure on a semiconductor substrate having an extension region including transistors having a first threshold voltage and a cell array region including transistors having a second threshold voltage greater than the first threshold voltage may comprise: providing the semiconductor substrate with a test voltage; determining, when the test voltage is provided, that the three-dimensional semiconductor memory device has a leakage current; providing the semiconductor substrate with a discrimination voltage less than the test voltage when the three-dimensional semiconductor memory device is determined to have the leakage current; determining whether the leakage current occurs in the extension region or the cell array region, wherein the leakage current is determined to occur in the extension region when the leakage current occurs while the discrimination voltage is provided, and wherein the leakage current is determined to occur in the cell array region when the leakage current does not occur while the discrimination voltage is provided.

DETAILED DESCRIPTION OF EMBODIMENTS

It will be hereinafter described in detail a three-dimensional semiconductor memory device and a method of detecting an electrical failure thereof according to exemplary embodiments in conjunction with the accompanying drawings.

Figure 1:
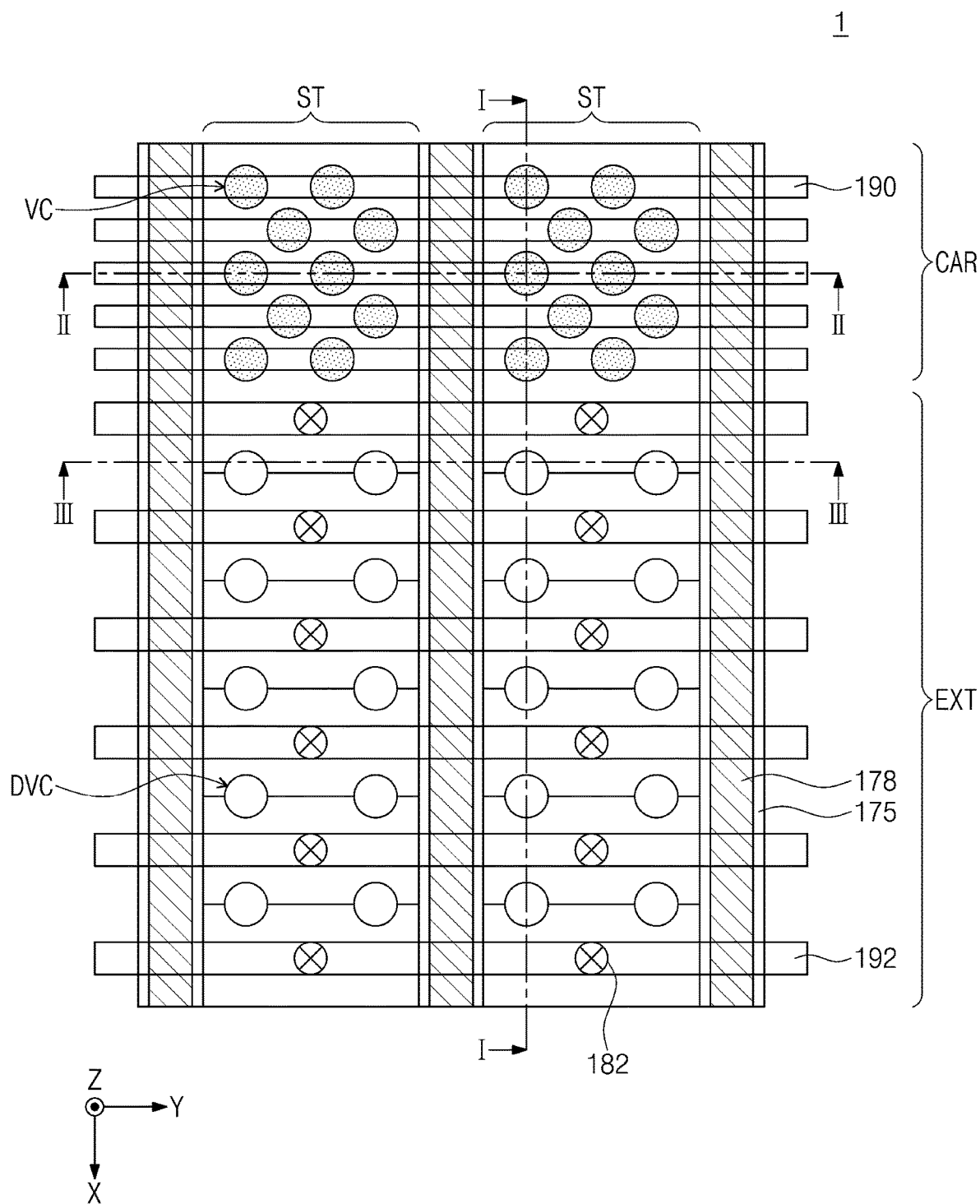
FIG. 1 illustrates a plan view showing a three-dimensional semiconductor memory device, according to exemplary embodiments.

FIG. 1 illustrates a plan view showing a three-dimensional semiconductor memory device, according to exemplary embodiments.

Referring to FIG. 1, a three-dimensional semiconductor memory device 1 may include a plurality of stack structures ST extending in a first direction X, a plurality of vertical channels VC and dummy vertical channels DVC penetrating each of the stack structures ST in a third direction Z, a plurality of bit lines 190 electrically connected to the vertical channels VC and extending in a second direction Y, a plurality of metal lines 192 electrically connected through metal contacts 182 to the stack structures ST and extending in the second direction Y, and a plurality of common source plugs 178 extending in the first direction X between the stack structures ST and electrically insulated through insulation spacers 175 from the stack structures ST.

The first and second directions X and Y may be substantially perpendicular to each other and horizontal directions extending along a semiconductor substrate (see, e.g., semiconductor substrate 100 of FIG. 2A) which will be discussed below. The third direction Z may be substantially perpendicular to the first and second directions X and Y and a vertical direction extending normal to the semiconductor substrate 100.

The three-dimensional semiconductor memory device 1 may be divided into a cell array region CAR and an extension region EXT. The vertical channels VC may be provided on the cell array region CAR, and the dummy vertical channels DVC may be provided on the extension region EXT. The bit lines 190 may run across the cell array region CAR along the second direction Y, and the metal lines 192 may run across the extension region EXT along the second direction Y. The stack structures ST and the common source plugs 178 may run across the cell array region CAR and the extension region EXT along the first direction X.

Figure 2A:
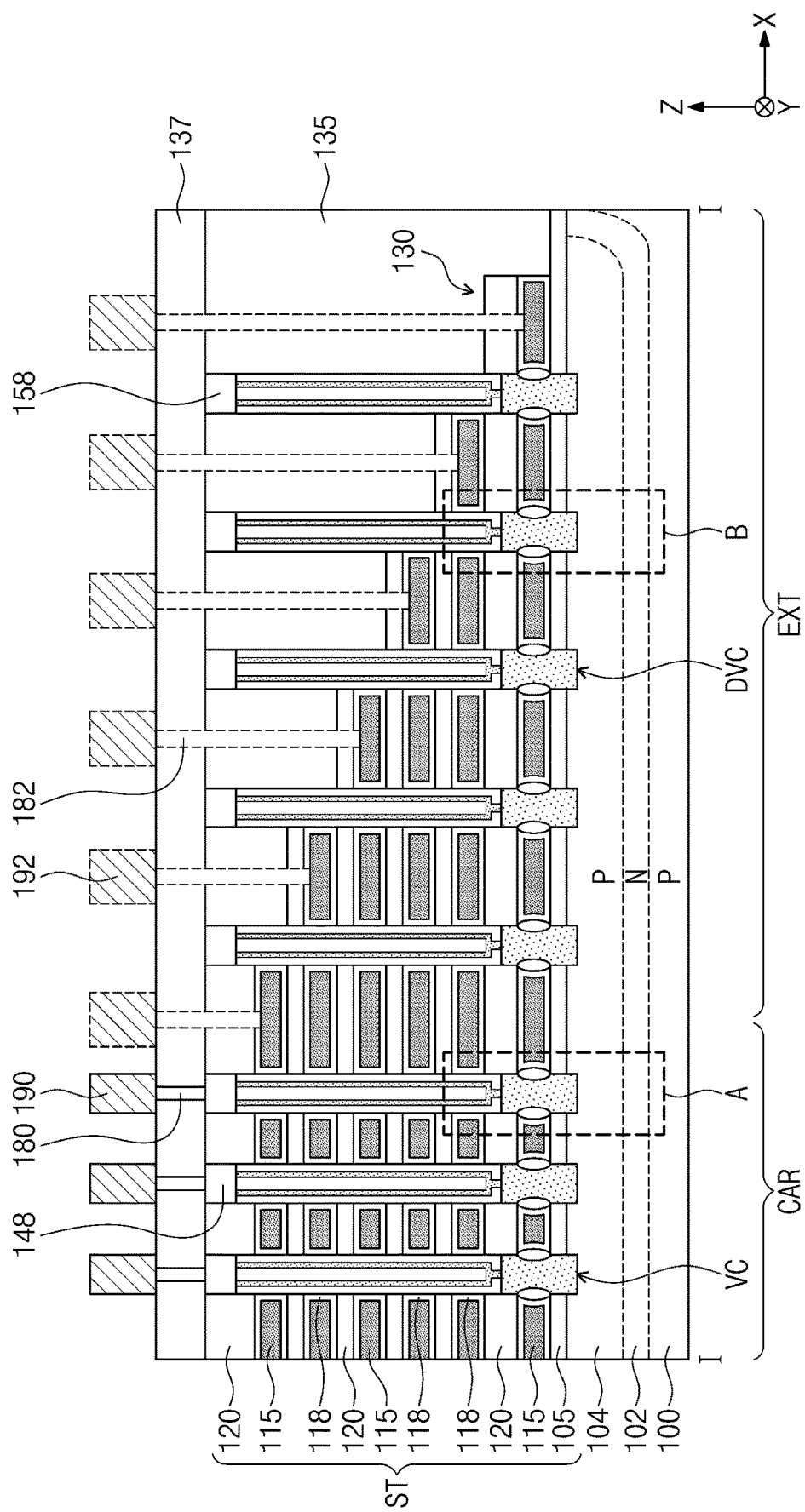
FIG. 2A illustrates a cross-sectional view taken along line I-I of FIG. 1.
Figure 2B:
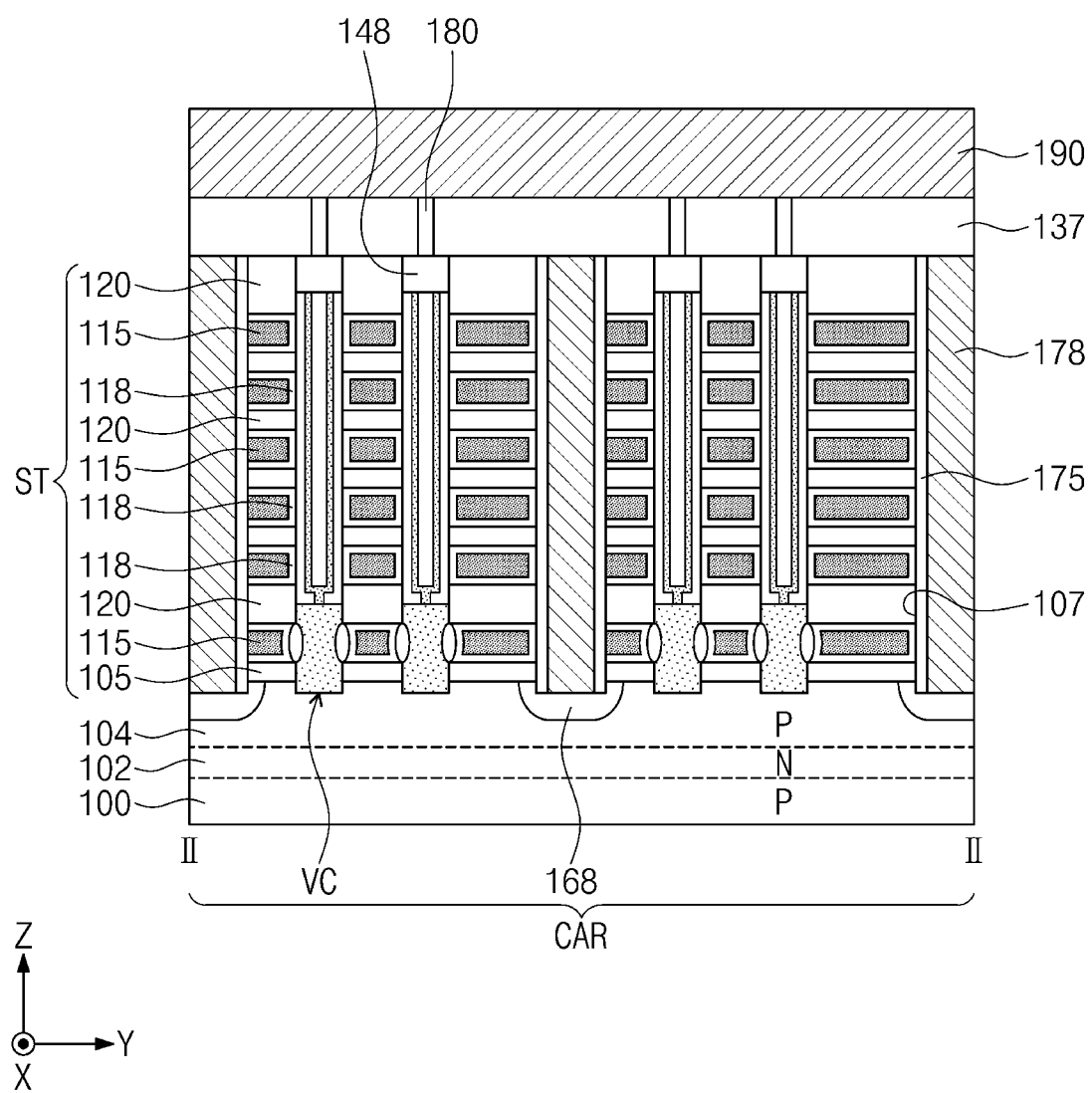
FIG. 2B illustrates a cross-sectional view taken along line II-II of FIG. 1.
Figure 2C:
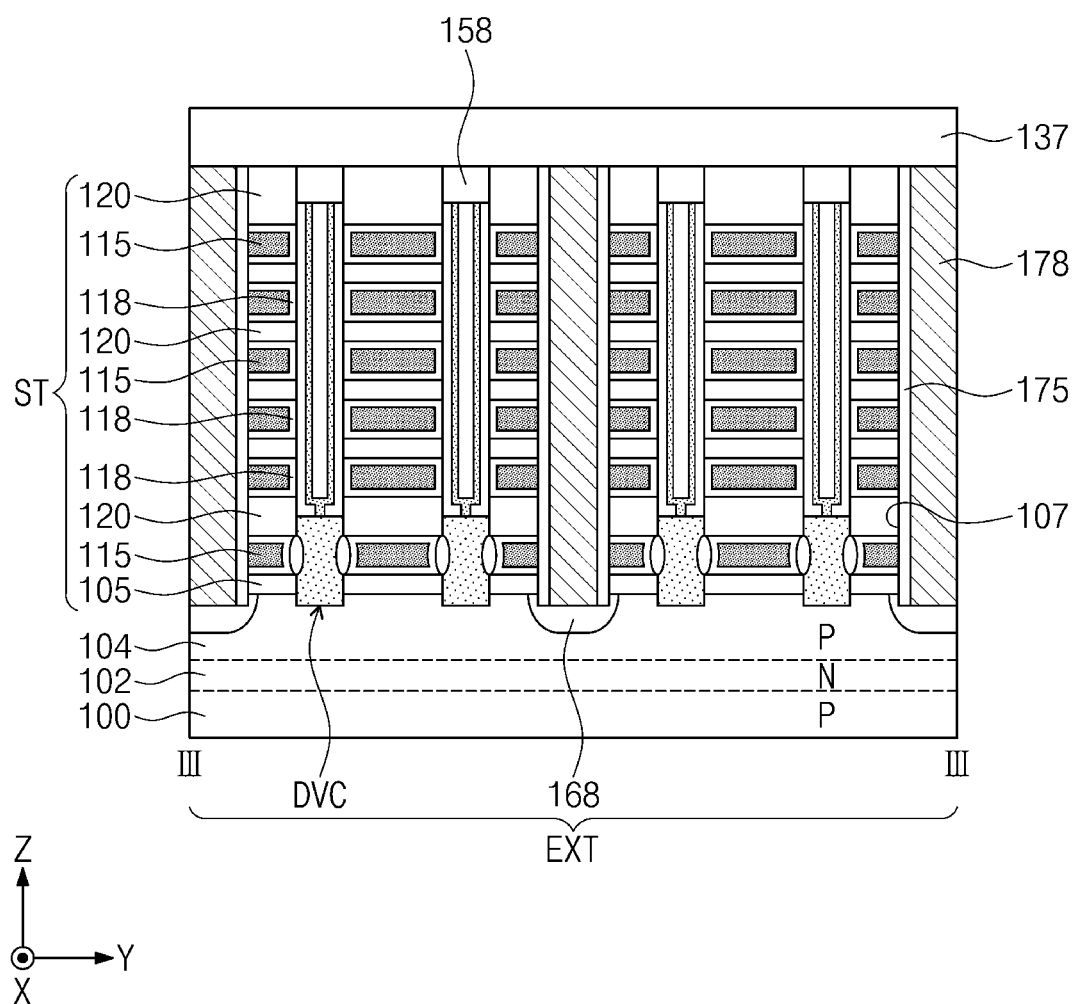
FIG. 2C illustrates a cross-sectional view taken along line III-III of FIG. 1.
Figure 2D:
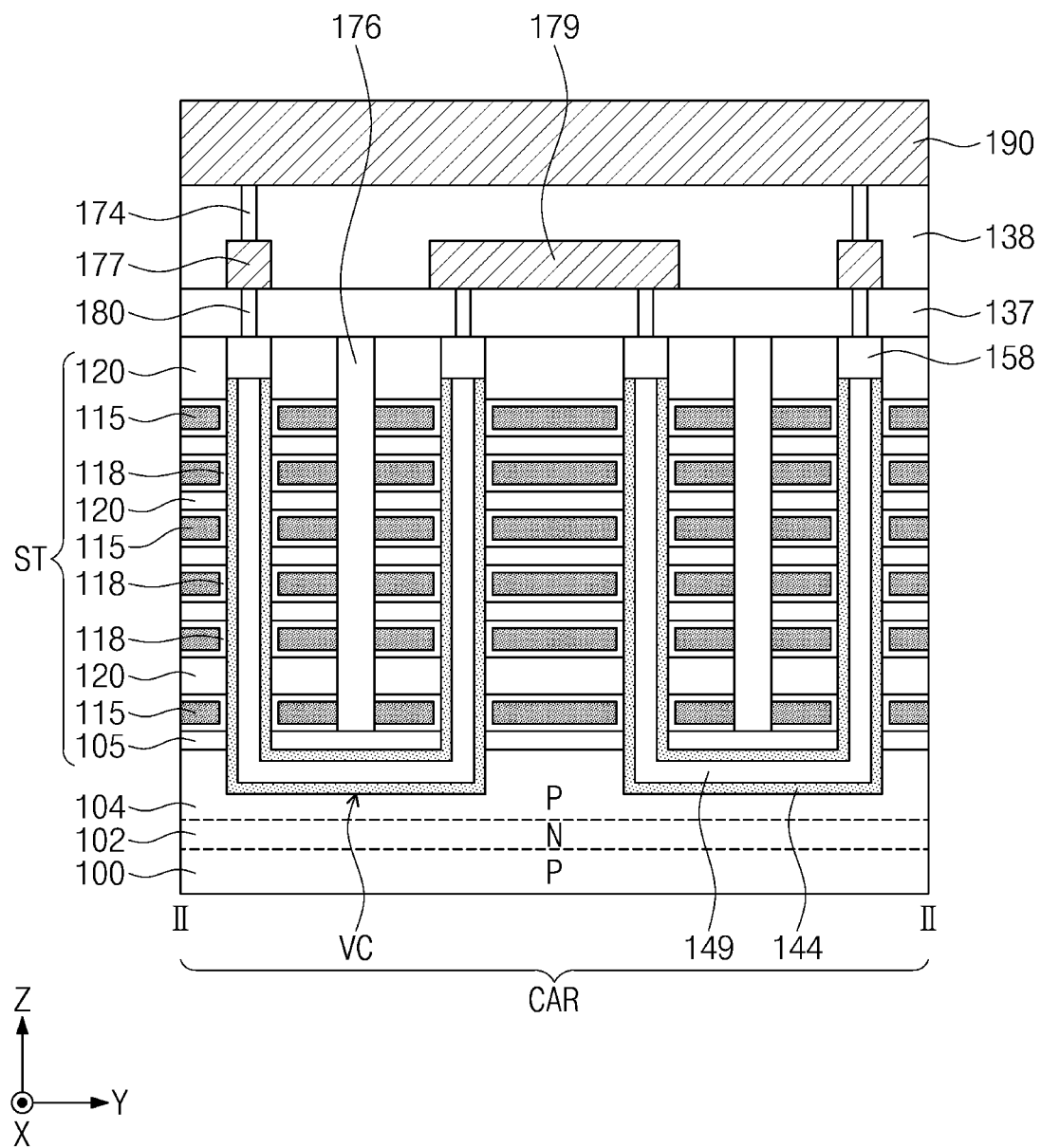
FIG. 2D illustrates a cross-sectional view showing other example of FIG. 2B.

The vertical channels VC and the dummy vertical channels DVC may have a pillar shape perpendicularly extending along the third direction Z, as illustrated in FIGS. 2A, 2B, and 2C. Alternatively, the vertical channels VC may have a U-like pipe shape, as illustrated in FIG. 2D. In the examples discussed herein, the dummy vertical channels DVC may have a pillar shape.

FIG. 2A illustrates a cross-sectional view taken along line I-I of FIG. 1. FIG. 2B illustrates a cross-sectional view taken along line II-II of FIG. 1. FIG. 2C illustrates a cross-sectional view taken along line III-III of FIG. 1. FIG. 2D illustrates a cross-sectional view showing other example of FIG. 2B.

Referring to FIGS. 2A, 2B, and 2C, the stack structures ST may be provided on a semiconductor substrate 100 having a first conductivity (e.g., P-type conductivity). The semiconductor substrate 100 may include a pocket well 104 having the first conductivity (e.g., P-type conductivity) and a deep well 102 having a second conductivity (e.g., N-type conductivity) surrounding the pocket well 104. The pocket well 104 and the deep well 102 may be provided throughout on the cell array region CAR and the extension region EXT.

Each of the stack structures ST may include a plurality of electrodes 115 and a plurality of insulation layers 120 that are alternately and repeatedly stacked along the third direction Z. The stack structure ST may further include an insulative buffer layer 105 between the semiconductor substrate 100 and a lowermost one of the electrodes 115. Each of the electrodes 115 may be partially or entirely surrounded by an insulation layer 118. At least one lowermost one of the insulation layers 120 may have a thickness greater than those of other ones of the insulation layers 120, where thickness of the insulation layers 120 is measured in the third direction Z. The stack structure ST may have a stepwise structure 130 on the extension region EXT, and the stepwise structure 130 may be covered with an insulative planarization layer 135 provided on the semiconductor substrate 100.

A lowermost electrode 115 may correspond to a gate electrode of a ground select line, and an uppermost electrode 115 may correspond to a gate electrode of a string select line. The lowermost and uppermost electrodes 115 may be provided therebetween with intermediate electrodes 115 corresponding to gate electrodes (or memory gate electrodes) of word lines. Optionally, at least one of the intermediate electrodes 115 may correspond to a dummy gate electrode of a dummy word line.

The common source plug 178 may be electrically connected to a common source 168 provided in the semiconductor substrate 100. The common source 168 may be provided in the pocket well 104 between the stack structures ST adjacent to each other. The common source 168 may have the second conductivity (e.g., N-type conductivity).

The semiconductor substrate 100 may be provided thereon with an interlayer dielectric layer 137 covering the stack structures ST and the planarization layer 135. The interlayer dielectric layer 137 may be provided thereon with bit lines 190, which are electrically connected to the vertical channels VC through a plurality of bit line contacts 180 penetrating the interlayer dielectric layer 137. For example, each vertical channel VC may be provided on its top end with a pad 148 coupled to one of the plurality of the bit line contacts 180, thereby electrically connecting the vertical channels VC to corresponding bit lines 190. The dummy vertical channels DVC may be provided on their top ends with dummy pads 158. The dummy vertical channels DVC may serve as supporters that support the stepwise structure 130, preventing collapse of the stack structures ST. The dummy vertical channels DVC are not effective to function for read or write operations. For example, dummy vertical channels DVC may not be electrically connected to bit line contacts, and therefore cannot connect to bit lines.

The metal lines 192 may be provided on the interlayer dielectric layer 137, and may be electrically connected to corresponding ends of the electrodes 115 through the metal contacts 182 penetrating the interlayer dielectric layer 137 and the planarization layer 135. For example, for each metal line 192, a bottom surface of the metal line 192 may contact a top surface of a metal contact 182, and the bottom surface of the metal contact 182 may contact a top surface of the end of a corresponding electrode 115.

Referring to FIG. 2D, the vertical channels VC on the cell array region CAR may have a U-like pipe shape. For example, the vertical channel VC may include two vertical segments perpendicularly extending along the third direction Z in the stack structure ST and a horizontal segment horizontally extending along the second direction Y in the pocket well 104 of the semiconductor substrate 100. The stack structure ST may be provided therein with an insulative separation layer 176 extending along the third direction Z between the two vertical segments, perpendicular to and above the horizontal segment in the pocket well 104. A second interlayer dielectric layer 138 may further be provided on the interlayer dielectric layer 137, and the bit line 190 may be provided on the second interlayer dielectric layer 138 to come into electrical connection with an end of the vertical channel VC. An opposite end of the vertical channel VC may be electrically connected to an electrode 179 provided on the interlayer dielectric layer 137. As discussed further below in connection with FIG. 3A, a memory layer 144 may have a U shape extending along the vertical channel VC, and have an inside filled with insulative filling layer 149. The interlayer dielectric layer 137 may be provided thereon with a metal pattern 174 and a metal contact 177 that electrically connect the bit line 190 and the bit line contact 180 to each other.

Figure 3A:
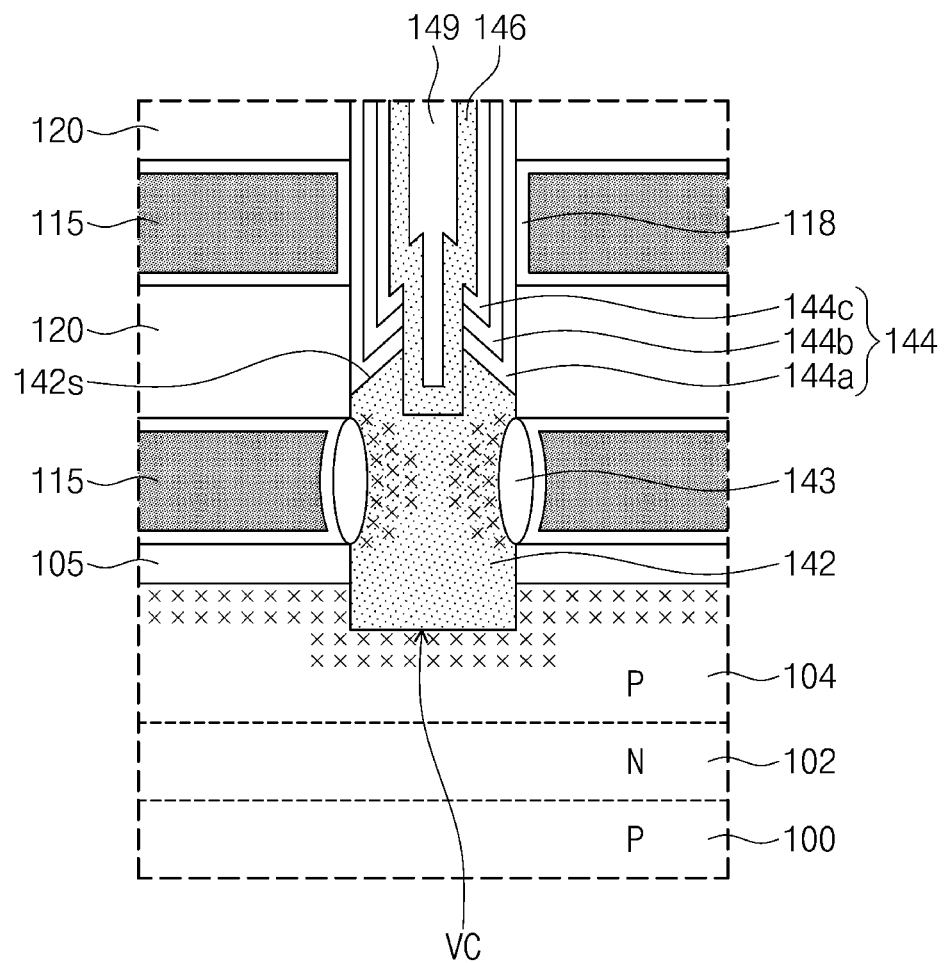
FIG. 3A illustrates an enlarged cross-sectional view showing section A of FIG. 2A.
Figure 3B:
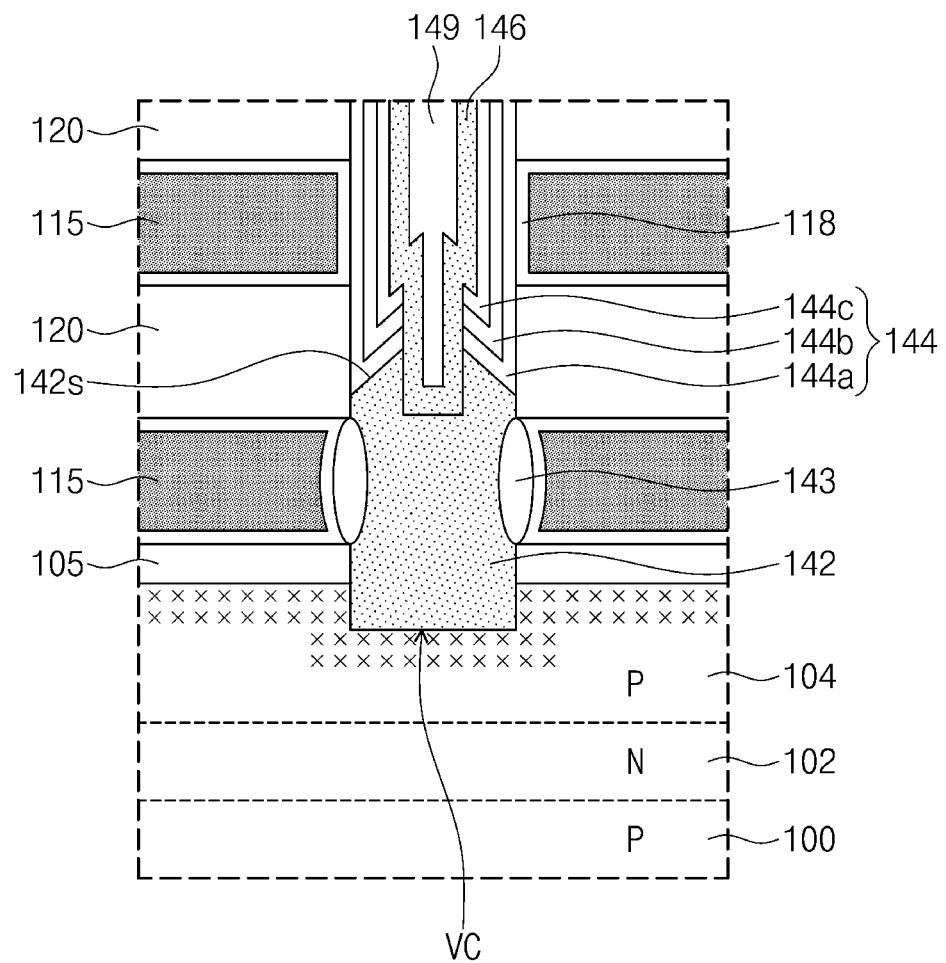
FIG. 3B illustrates a cross-sectional view showing other example of FIG. 3A.
Figure 3C:
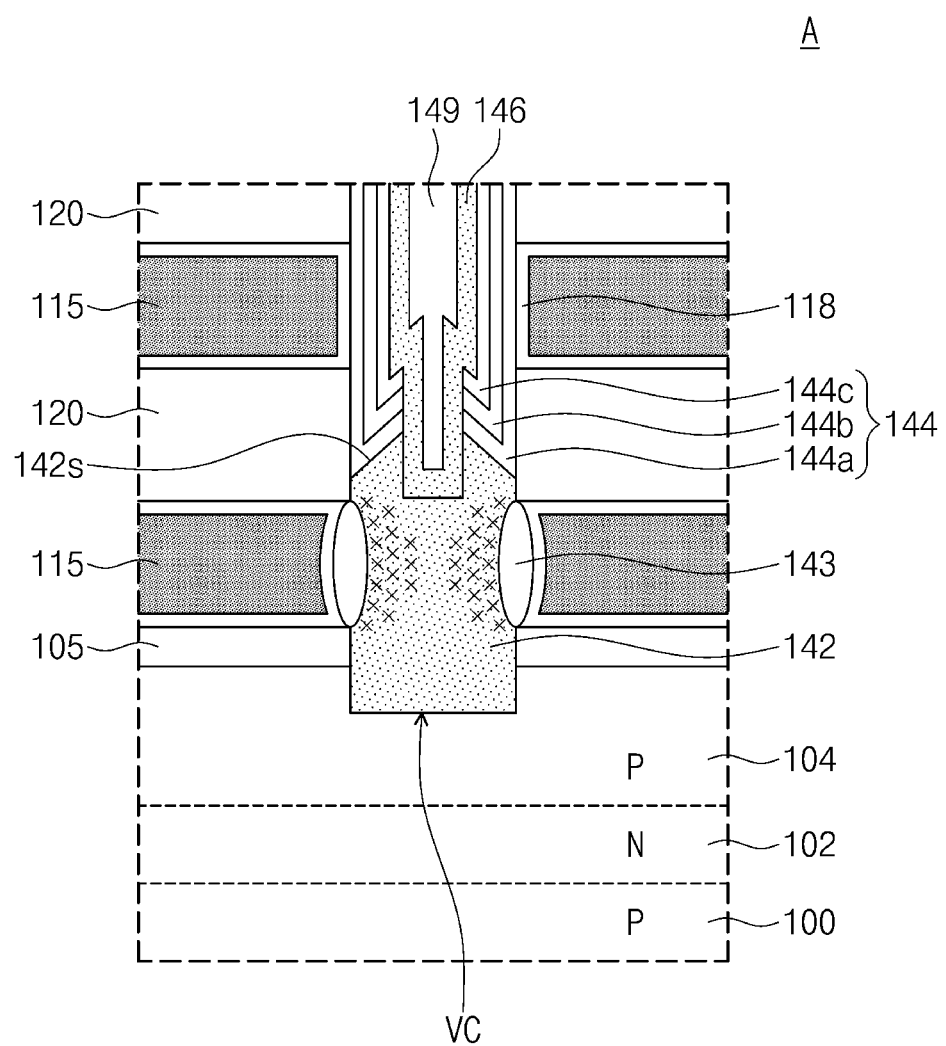
FIG. 3C illustrates a cross-sectional view showing other example of FIG. 3A.
Figure 3D:
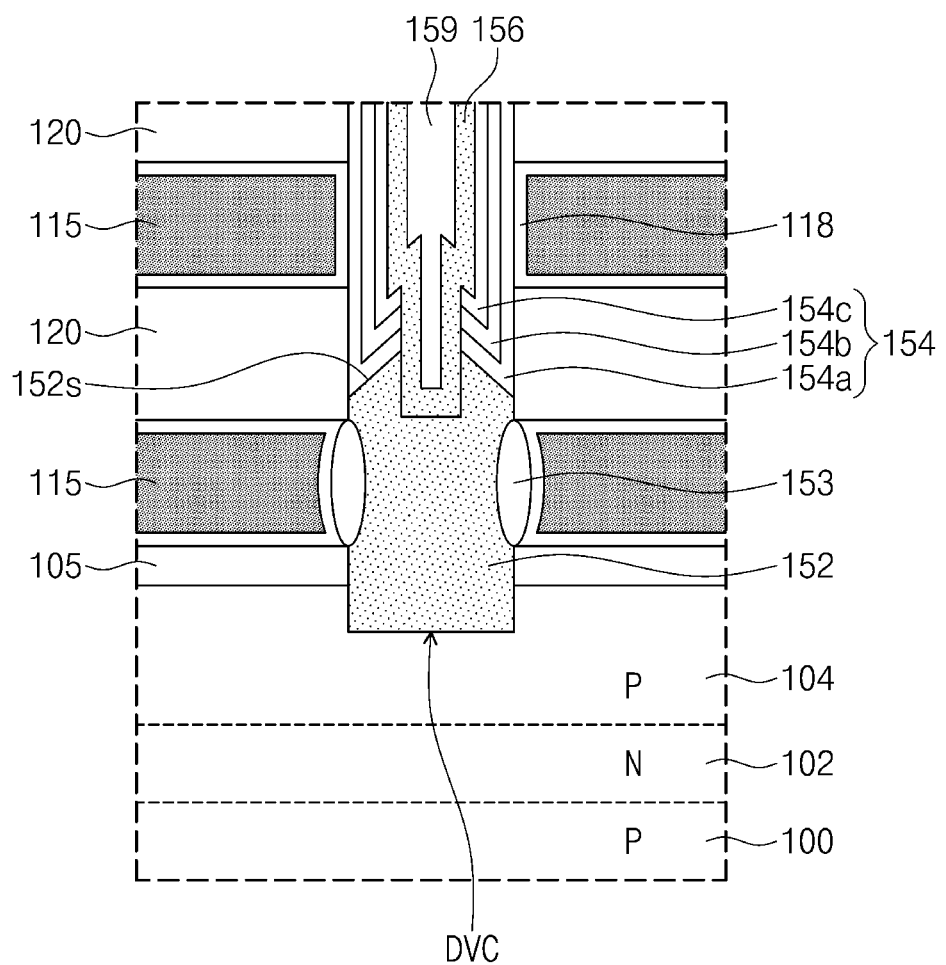
FIG. 3D illustrates an enlarged cross-sectional view showing section B of FIG. 2A.

FIG. 3A illustrates an enlarged cross-sectional view showing section A of FIG. 2A. FIG. 3B illustrates another example of FIG. 3A. FIG. 3C illustrates a cross-sectional view showing other example of FIG. 3A. FIG. 3D illustrates an enlarged cross-sectional view showing section B of FIG. 2A.

Referring to FIG. 3A, the vertical channel VC may include a lower channel 142, an upper channel 146, and a memory layer 144. The lower channel 142 may be or may include a pillar-shaped semiconductor layer epitaxially grown from the pocket well 104 of the semiconductor substrate 100. The lower channel 142 may have a convex or flat top surface 142s that does not protrude above the lowermost insulation layer 120. In some embodiments, the top surface 142s of the lower channel 142 may be at level higher than a bottom surface of the lowermost insulation layer 120 and at a lower level than a top surface of the lowermost insulation layer 120. A gate dielectric layer 143 may be provided on a sidewall of the lower channel 142. The gate dielectric layer 143 may be at a same vertical level as the lowermost electrode 115. The lower channel 142 may combine with the lowermost electrode 115, or a select gate electrode, to constitute a ground selection transistor.

The upper channel 146 may contact the lower channel 142, and may have a U shape or a pipe shape having a closed bottom end. It will be understood that when an element is referred to as being "connected" or "coupled" to, "in contact with," or "on" another element, it can be directly connected or coupled to, in contact with, or on the other element or intervening elements may be present. The upper channel 146 may have an inside filled with an insulative filling layer 149. For example, the upper channel 146 may have a hollow center area, and the hollow center area may be filled with the insulative filling layer 149. The memory layer 144 may include one or more insulation layers. For example, the memory layer 144 may include a tunnel insulation layer 144c adjacent to the upper channel 146, a blocking insulation layer 144a adjacent to the electrodes 115, and a charge storage layer 144b between the tunnel insulation layer 144c and the blocking insulation layer 144a. The insulation layer 118 may be used as a portion of, for example, the blocking insulation layer 144a, of the memory layer 144.

The lower channel 142 may be coupled to the pocket well 104 on the cell array region CAR, thereby electrically connecting the lower channel to the pocket well 104. According to some embodiments, the lower channel 142 and the pocket well 104 may be used as a channel of the ground selection transistor on the cell array region CAR. The lowermost electrode 115 may serve as a gate electrode of the ground selection transistor for controlling electric connection between the common source 168 and the upper channel 146. The pocket well 104 on the cell array region CAR may have the first conductivity (e.g., P-type conductivity), and the lower channel 142 may be intrinsic or have the first conductivity (e.g., P-type conductivity). In addition, the lower channel 142 and the pocket well 104 on the cell array region CAR may be doped with impurities having the second conductivity (e.g., N-type conductivity), for example, boron (B) or a boron-containing compound (e.g., $BH_3$). Alternatively, as illustrated in FIG. 3B, the pocket well 104 on the cell array region CAR may be doped with the second conductivity impurities (e.g., B or $BH_3$). In the embodiment illustrated in FIG. 3B, the lower channel 142 is not doped with the second conductivity impurities. Dissimilarly, as illustrated in FIG. 3C, only the lower channel 142 may be doped with the second conductivity impurities (e.g., B or $BH_3$). In the embodiment illustrated in FIG. 3C, the pocket well 104 is not doped with the second conductivity impurities. Thus, in the examples of FIGS. 3A and 3C, a portion of the vertical channel VC may be doped with impurities having the second conductivity type (e.g., N-type conductivity). The symbol X in FIGS. 3A, 3B, and 3C may indicate a doped region doped with the second conductivity impurities (e.g., B or $BH_3$).

Referring to FIG. 3D, the dummy vertical channel DVC may be configured identically or similarly to the vertical channel VC. For example, the dummy vertical channel DVC may include a dummy lower channel 152, a dummy upper channel 156, and a dummy memory layer 154.

The dummy lower channel 152 may be or may include a pillar-shaped semiconductor layer epitaxially grown from the pocket well 104 of the semiconductor substrate 100. The dummy lower channel 152 may have a convex or flat top surface 152s that does not protrude above the lowermost insulation layer 120. For example, the top surface 152s of the dummy lower channel 152 may be at level higher than a bottom surface of the lowermost insulation layer 120 and at a lower level than a top surface of the lowermost insulation layer 120. A dummy gate dielectric layer 153 may be provided on a sidewall of the dummy lower channel 152. The dummy gate dielectric layer 153 may be at the same vertical level as the lowermost electrode 115. The dummy upper channel 156 may contact the dummy lower channel 152, and may have a U shape or a pipe shape having a closed bottom end. The dummy upper channel 156 may have an inside filled with a dummy insulative filling layer 159. For example, the dummy upper channel 156 may have a hollow center area, and the hollow center area may be filled with the dummy insulative filling layer 159. The dummy memory layer 154 may include one or more insulation layers. For example, the dummy memory layer 154 may include a dummy tunnel insulation layer 154*c* adjacent to the dummy upper channel 156, a dummy blocking insulation layer 154*a* adjacent to the electrodes 115, and a dummy charge storage layer 154*b* between the dummy tunnel insulation layer 154*c* and the dummy blocking insulation layer 154*a*. The insulation layer 118 may be used as a portion of, for example, the dummy blocking insulation layer 154*a*, of the dummy memory layer 154.

According to some embodiments, the dummy lower channel 152 may combine with the lowermost electrode 115, or a select gate electrode, to constitute a dummy ground selection transistor. The dummy lower channel 152 may be coupled to the pocket well 104 on the extension region EXT, thereby electrically connecting the lower channel to the pocket well 104. The dummy lower channel 152 and the pocket well 104 may be used as a channel of the dummy ground selection transistor on the extension region EXT. The pocket well 104 on the extension region EXT may have the first conductivity (e.g., P-type conductivity), and the dummy lower channel 152 may be intrinsic or have the first conductivity (e.g., P-type conductivity). In addition, the dummy lower channel 152 and the pocket well 104 on the extension region EXT may not be doped with impurities having the second conductivity (e.g., N-type conductivity), for example, boron (B) or a boron-containing compound (e.g., $BH_3$).

As discussed above, one or more of the lower channel 142 and the pocket well 104 on the cell array region CAR may be doped with the second conductivity impurities (e.g., B or $BH_3$). In contrast, the dummy lower channel 152 and the pocket well 104 on the extension region EXT may not be doped with the second conductivity impurities. As such, the irregular doping of the second conductivity impurities may allow the cell array region CAR and the extension region EXT to have different threshold voltages from each other. For example, the lowermost electrode 115, or a ground select line, may have a first threshold voltage (e.g., about 0 V to about 0.5 V) on the extension region EXT and a second threshold voltage (e.g., about 3 V) on the cell array region CAR, where the second threshold voltage is greater than the first threshold voltage. For example, the ground selection transistor on the cell array region CAR may have the first threshold voltage and the dummy ground selection transistor on the extension region EXT may have the second threshold voltage different from the first threshold voltage.

The different threshold voltages of the cell array region CAR and the extension region EXT may be used to determine which one of the cell array region CAR and the extension region EXT causes an electrical failure (e.g., a leakage current).

Figure 13:
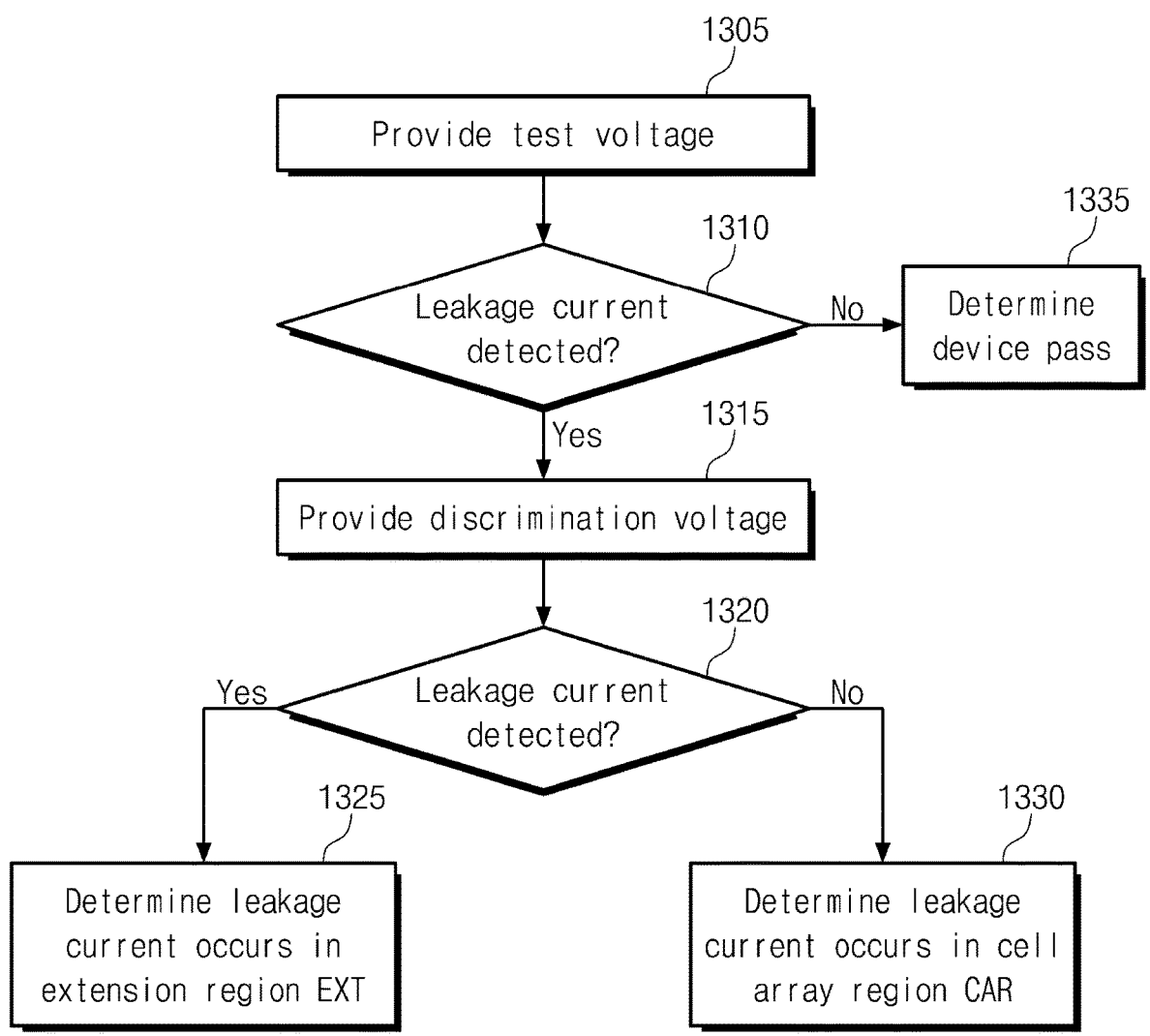
FIG. 13 is a flowchart of an exemplary method of detecting an electrical failure of a three-dimensional semiconductor memory device, according to exemplary embodiments.

FIG. 13 is a flowchart of a method of detecting an electrical failure of a three-dimensional semiconductor memory device. The method of FIG. 13 may be performed by any type of electronic device configured to execute one or more processes, such as, for example, a computing device. Such a computing device may include one or more of the following components: at least one central processing unit (CPU) configured to execute computer program instructions to perform various processes and methods, random access memory (RAM) and read only memory (ROM) configured to access and store data and information and computer program instructions, I/O devices configured to provide input and/or output to the computing device (e.g., keyboard, mouse, display, etc.), and storage media or other suitable type of memory, where the files that comprise an operating system, application programs, and/or other applications, and data files are stored. The computing device may be configured to perform the functions described herein, which such functions implemented in hardware, software, firmware, or any combination thereof. If implemented in software, the functions can be stored as one or more instructions or code on computer-readable medium, including the computer-readable medium described above (e.g., RAM, ROM, storage media, etc.).

In some embodiments, the semiconductor substrate 100 may be provided with a test voltage (step 1305). For example, the pocket well 104 may be supplied with a high voltage (e.g., 3 V) as the test voltage, and the test voltage may be greater than each of the first and second threshold voltages. If no leakage current is detected when the high voltage is applied (step 1310, No), the three-dimensional semiconductor memory device 1 may be determined to be electrically operational and may pass testing (step 1335). In contrast, if a leakage current is detected when the high voltage is applied (step 1310, Yes), further steps may be performed to determine which one of the cell array region CAR and the extension region EXT causes the leakage current.

The semiconductor substrate 100 may be provided with a discrimination voltage (step 1315). The discrimination voltage may be less than the high voltage. For example, the pocket well 104 may be supplied with the discrimination voltage (e.g., 1V) between the first and second threshold voltages. The test voltage is not applied when the discrimination voltage is applied. When the discrimination voltage is applied, the ground selection transistor on the cell array region CAR may become in an electrically OFF state, while the dummy ground selection transistor on the extension region EXT may become in an electrically ON state. If the leakage current is detected when the discrimination voltage is applied (step 1320, Yes), it may be determined that the leakage current originates from the extension region EXT in the electrically ON state (step 1325).

In contrast, no leakage current may be detected when the discrimination voltage is applied (step 1320, No). For example, the leakage current may be detected when the high voltage (e.g., 3 V) is applied, but not when the discrimination voltage (e.g., 1 V) is applied. In this case, it may be determined that the leakage current originates from the cell array region CAR that is in the electrically OFF state at the discrimination voltage and ON state at the high voltage (step 1330).

As discussed above, since the cell array region CAR and the extension region EXT may be configured to have different threshold voltages, it may be possible to determine the occurrence location of an electrical failure, such as leakage current. Accordingly, the three-dimensional semiconductor memory device 1 may increase in manufacturing yield by controlling or changing process recipes in connection with the electrical failure location.

Figure 4A:
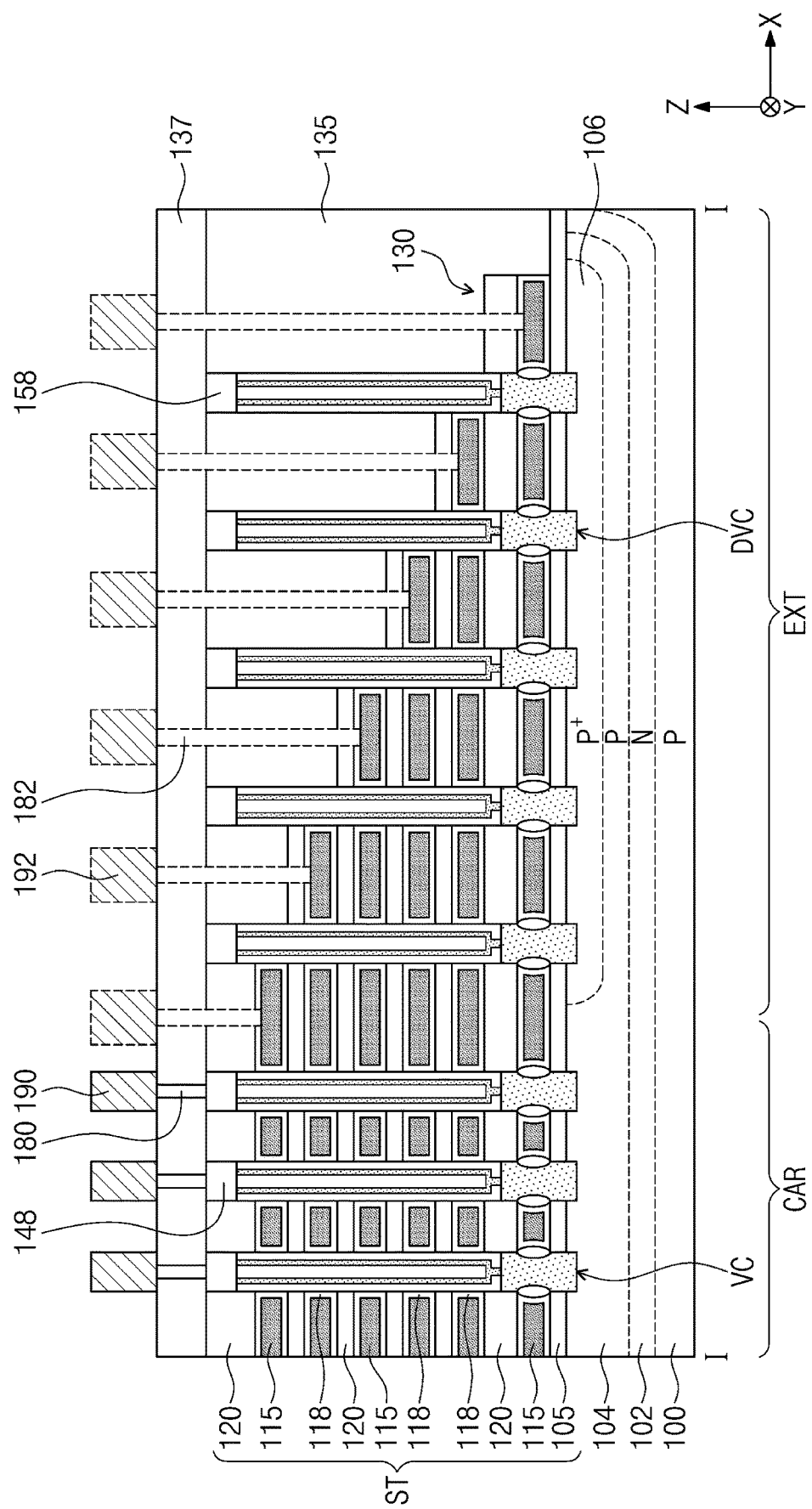
FIG. 4A illustrates a cross-sectional view taken along line I-I of FIG. 1.
Figure 4B:
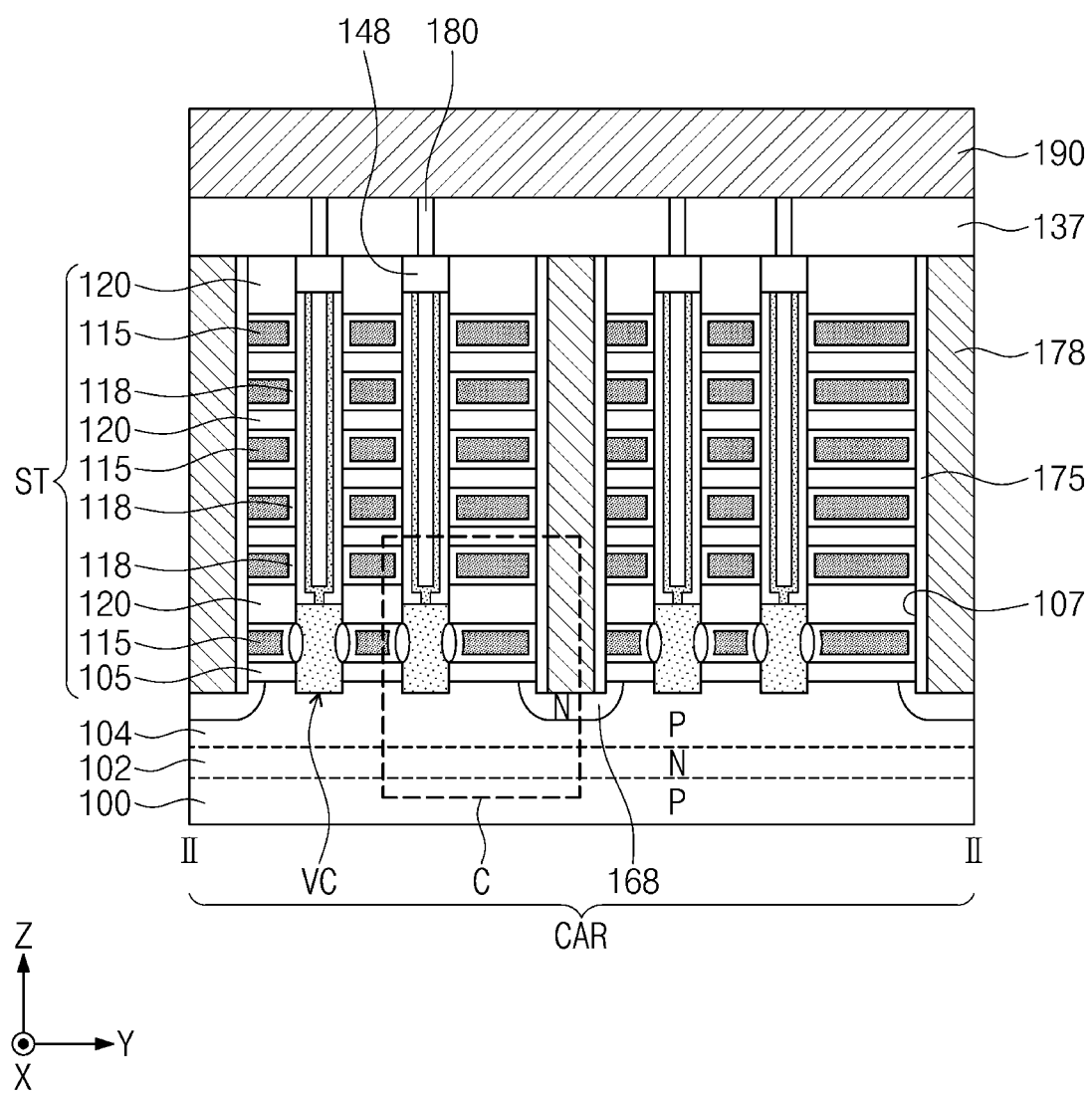
FIG. 4B illustrates a cross-sectional view taken along line II-II of FIG. 1.
Figure 4C:
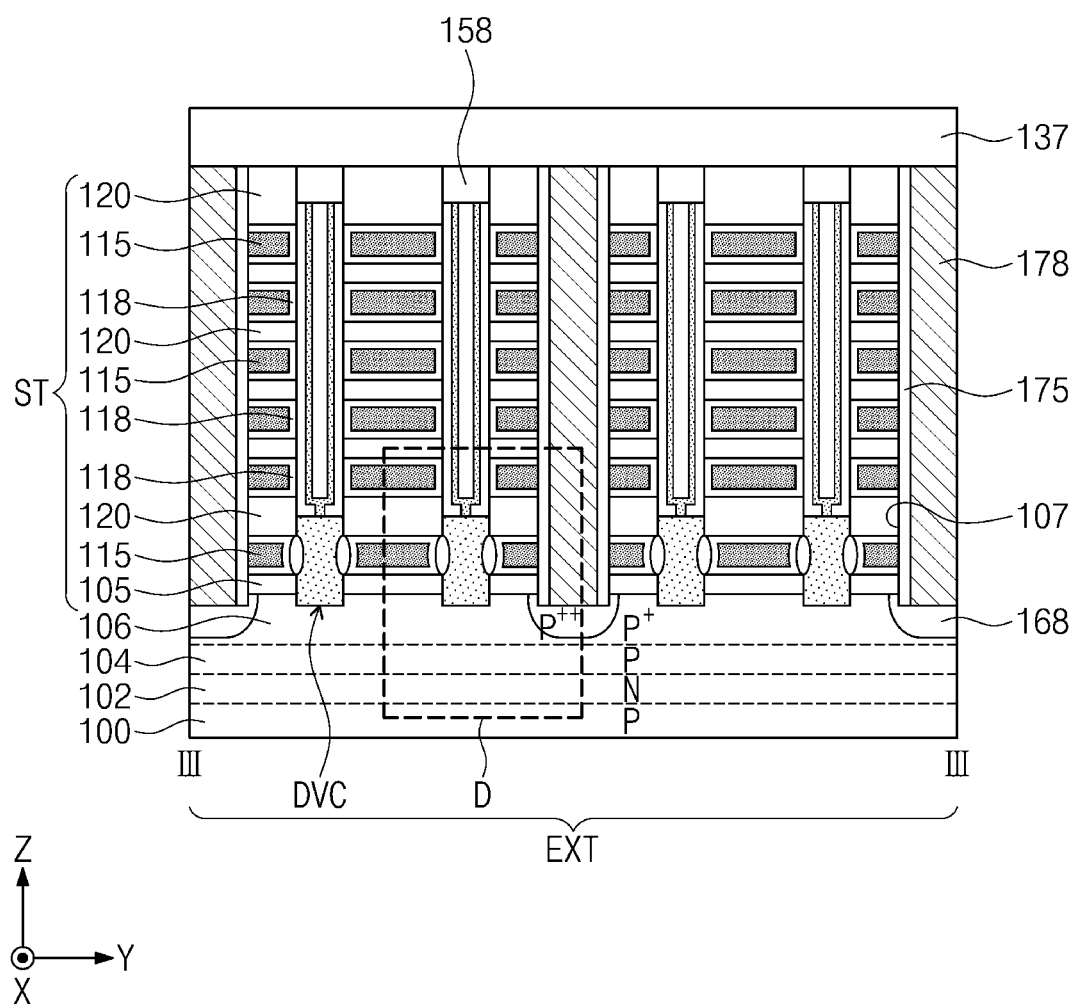
FIG. 4C illustrates a cross-sectional view taken along line III-III of FIG. 1.

FIG. 4A illustrates a cross-sectional view taken along line I-I of FIG. 1. FIG. 4B illustrates a cross-sectional view taken along line II-II of FIG. 1. FIG. 4C illustrates a cross-sectional view taken along line III-III of FIG. 1.

Referring to FIGS. 4A, 4B, and 4C, the semiconductor substrate 100 may further include a second pocket well 106 surrounded by the pocket well 104. The second pocket well 106 may be provided on the extension region EXT, not on the cell array region CAR. The second pocket well 106 may have the first conductivity (e.g., P-type conductivity) and an impurity concentration greater than that of the pocket well 104. For example, the impurity concentration of the pocket well 104 may be about $10E13$ atoms/cm$^3$, and the impurity concentration of the second pocket well 106 may be about $10E16$ atoms/cm$^3$.

The common source 168 on the cell array region CAR may have the second conductivity (e.g., N-type conductivity), and the common source 168 on the extension region EXT may have the first conductivity (e.g., P-type conductivity). The common source 168 on the extension region EXT may have an impurity concentration greater than that of the second pocket well 106. For example, the common source 168 on the extension region EXT may have an impurity concentration of about $10E17$ atoms/cm$^3$.

Figure 5A:
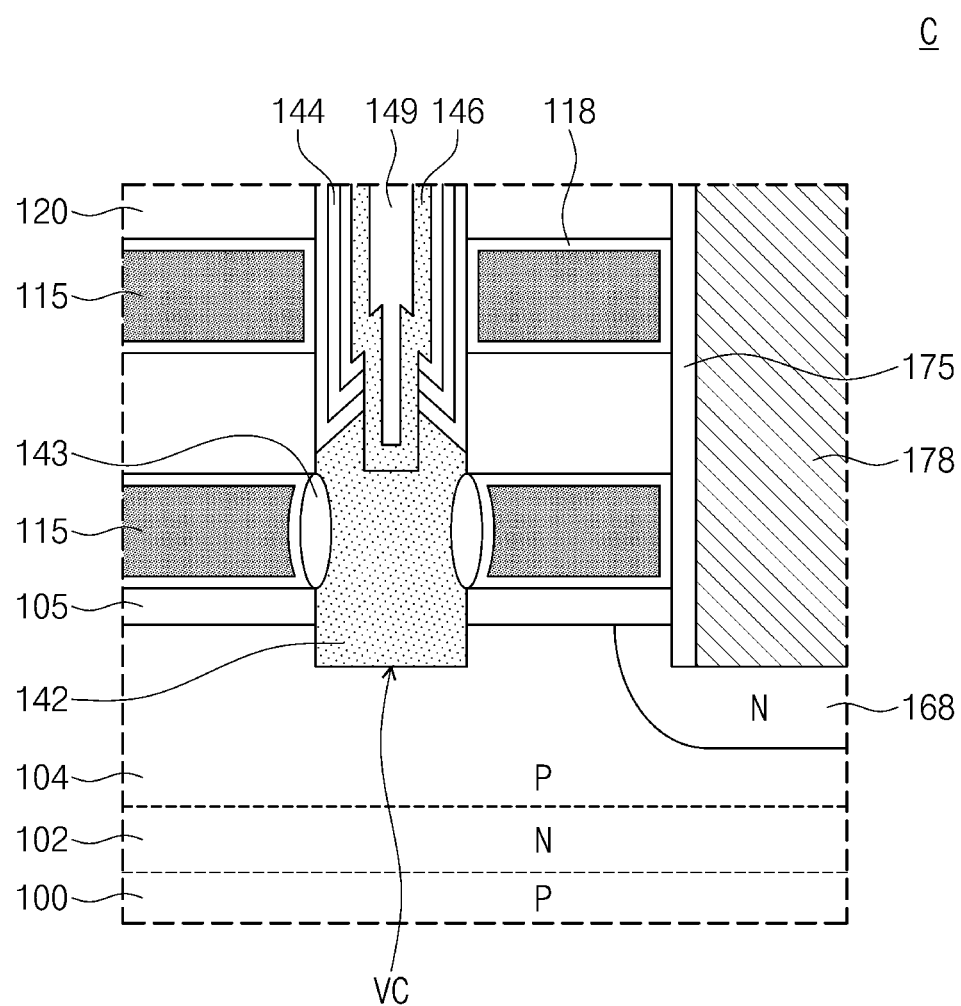
FIG. 5A illustrates an enlarged cross-sectional view showing section C of FIG. 4B.
Figure 5B:
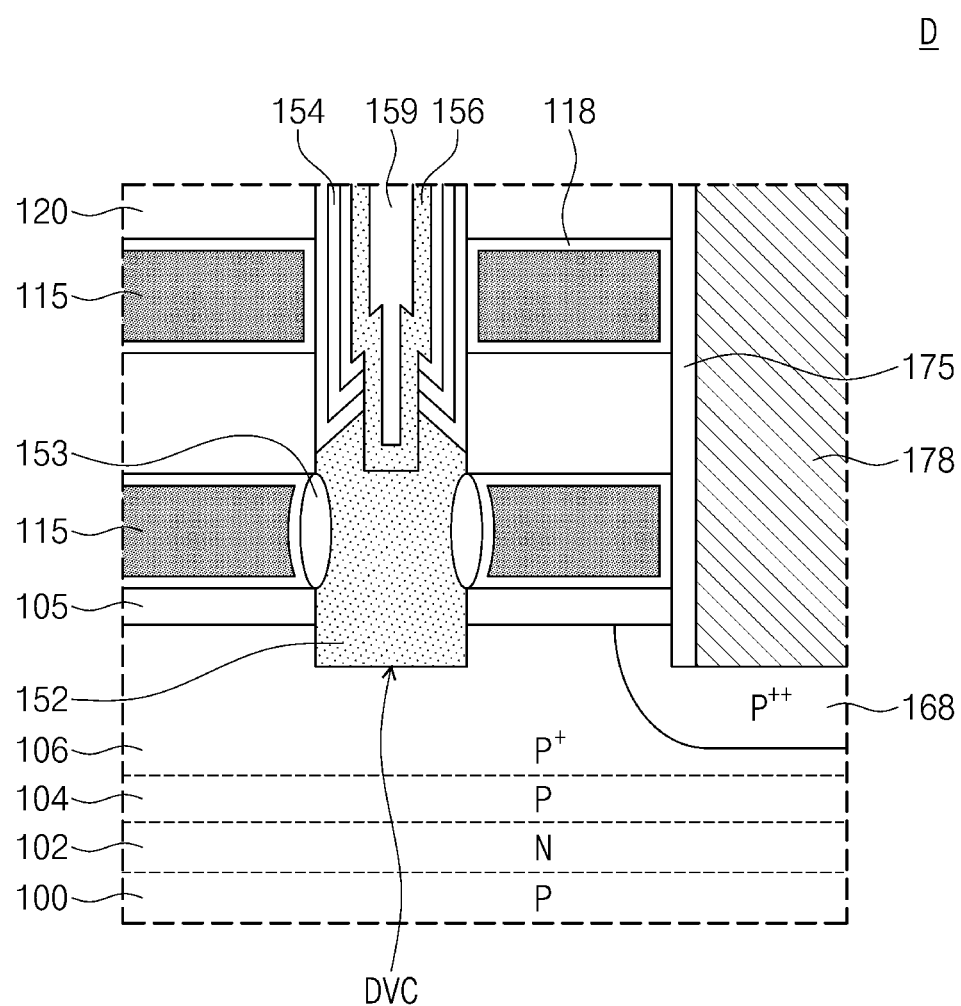
FIG. 5B illustrates an enlarged cross-sectional view showing section D of FIG. 4C.

FIG. 5A illustrates an enlarged cross-sectional view showing section C of FIG. 4B. FIG. 5B illustrates an enlarged cross-sectional view showing section D of FIG. 4C.

Referring to FIGS. 5A and 5B, when the pocket well 104 is supplied with a positive bias or a ground voltage, the ground selection transistor on the cell array region CAR may become in an electrically ON state and the dummy ground selection transistor on the extension region EXT may become in an electrically OFF state. In this case, when a leakage current is detected, it may be determined that the leakage current occurs in the cell array region CAR.

Alternatively, when the pocket well 104 is supplied with a negative bias, the ground selection transistor on the cell array region CAR may become in an electrically OFF state and the dummy ground selection transistor on the extension region EXT may become in an electrically ON state. In this case, when a leakage current is detected, it may be determined that the leakage current occurs in the extension region EXT.

FIGS. 6A, 7A, 8A, 9A, 10A, 11A, and 12A illustrate cross-sectional view taken along line I-I of FIG. 1, showing a method of manufacturing a three-dimensional semiconductor memory device according to exemplary embodiments. FIGS. 6B, 7B, 8B, 9B, 10B, 11B, and 12B illustrate cross-sectional views taken along line II-II of FIG. 1, showing a method of manufacturing a three-dimensional semiconductor memory device according to exemplary embodiments. FIGS. 6C, 7C, 8C, 9C, 10C, 11C, and 12C illustrate cross-sectional views taken along line III-III of FIG. 1, showing a method of manufacturing a three-dimensional semiconductor memory device according to exemplary embodiments.

Figure 6A:
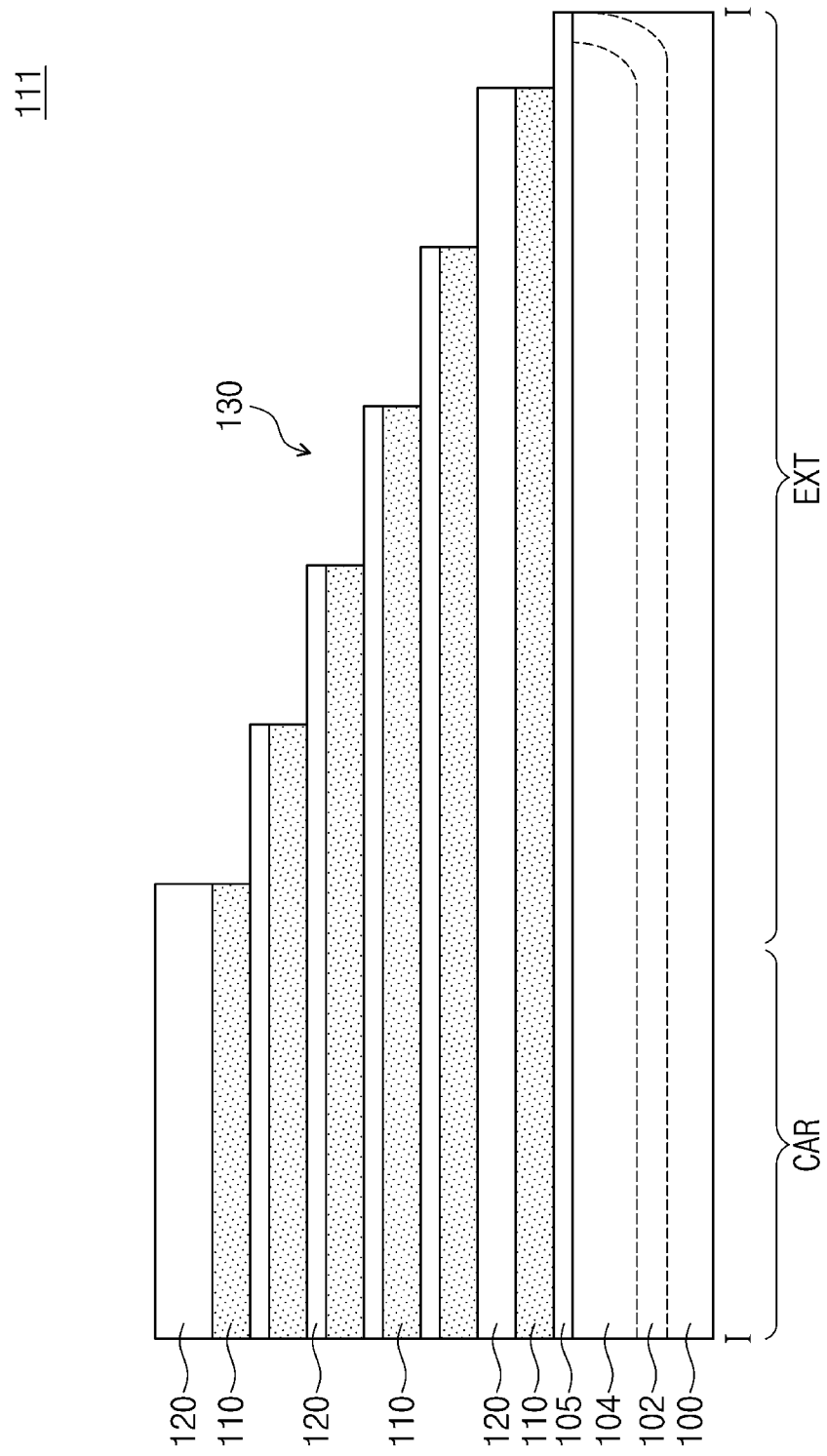
FIGS. 6A, 7A, 8A, 9A, 10A, 11A, and 12A illustrate cross-sectional views taken along line I-I of FIG. 1, showing a method of manufacturing a three-dimensional semiconductor memory device, according to exemplary embodiments.
Figure 6B:
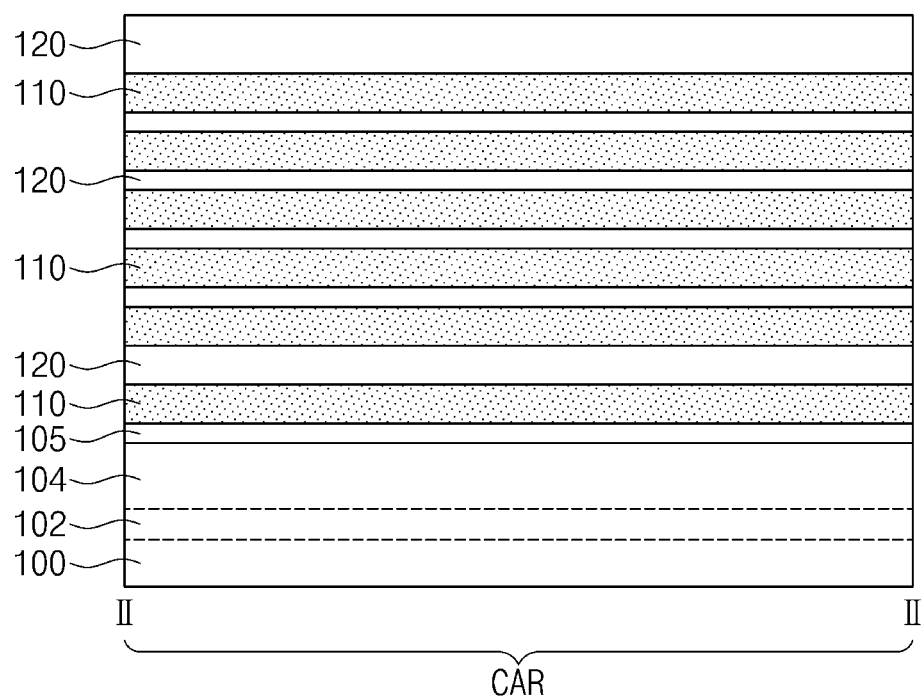
FIGS. 6B, 7B, 8B, 9B, 10B, 11B, and 12B illustrate cross-sectional views taken along line II-II of FIG. 1, showing a method of manufacturing a three-dimensional semiconductor memory device, according to exemplary embodiments.
Figure 6C:
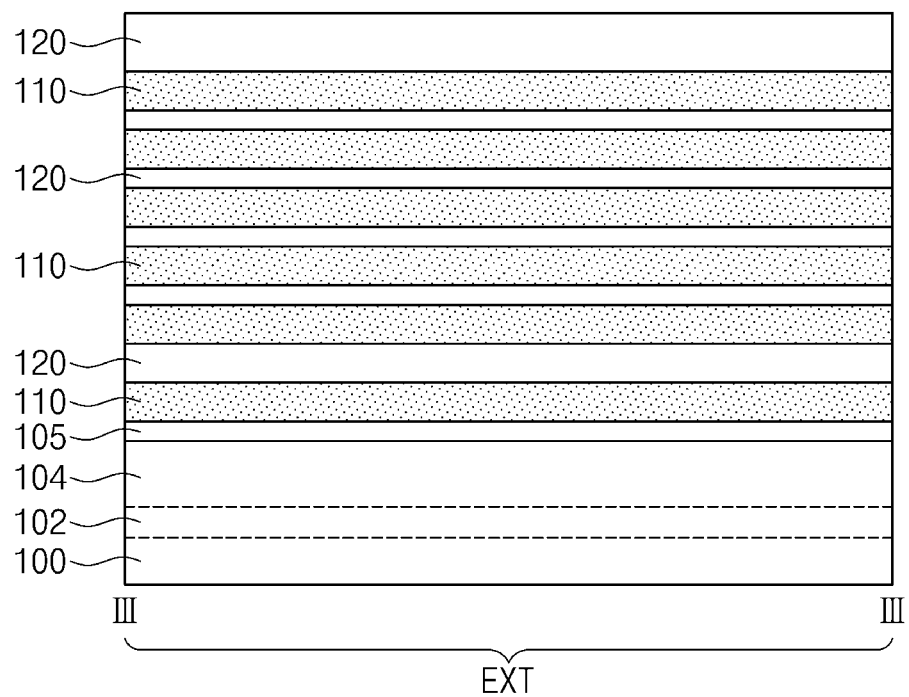
FIGS. 6C, 7C, 8C, 9C, 10C, 11C, and 12C illustrate cross-sectional views taken along line III-III of FIG. 1, showing a method of manufacturing a three-dimensional semiconductor memory device, according to exemplary embodiments.

Referring to FIGS. 6A, 6B, and 6C, there may be provided a semiconductor substrate 100 that can be divided into a cell array region CAR and an extension region EXT. The semiconductor substrate 100 may be or may include a silicon wafer having a first conductivity (e.g., P-type conductivity). The semiconductor substrate 100 may be doped with impurities having a second conductivity (e.g., N-type conductivity) to form a deep well 102, and then doped with impurities having the first conductivity (e.g., P-type conductivity) to form a pocket well 104 in the deep well 102. In some embodiments, a second pocket well (see, e.g., second pocket well 106 of FIG. 4A) may further be formed by implanting the first conductivity impurities into the pocket well 104 on the extension region EXT.

Optionally, a substrate doping may be performed to implant the second conductivity impurities (e.g., B or BH$_3$) into the pocket well 104 on the cell array region CAR, such that the cell array region CAR and the extension region EXT may be controlled to have different threshold voltages from each other. For example, the threshold voltage of the cell array region CAR may be controlled to be greater than that of the extension region EXT. Alternatively, in some embodiments, no substrate doping of the second conductivity impurities into the pocket well 104 is performed for controlling the threshold voltage.

A plurality of sacrificial layers 110 and a plurality of insulation layers 120 may be alternately and repeatedly stacked on the semiconductor substrate 100 having the well structure. The stacked plurality of sacrificial layers 110 and plurality of insulation layers 120 may form a mold structure 111. An insulative buffer layer 105 may further be formed between the semiconductor substrate 100 and a lowermost one of the sacrificial layers 110. The mold structure 111 may be patterned to form a stepwise structure 130 on the extension region EXT. The sacrificial layers 110 may include a silicon nitride layer, and the insulation layers 120 and the buffer layer 105 may include a silicon oxide layer.

Figure 7A:
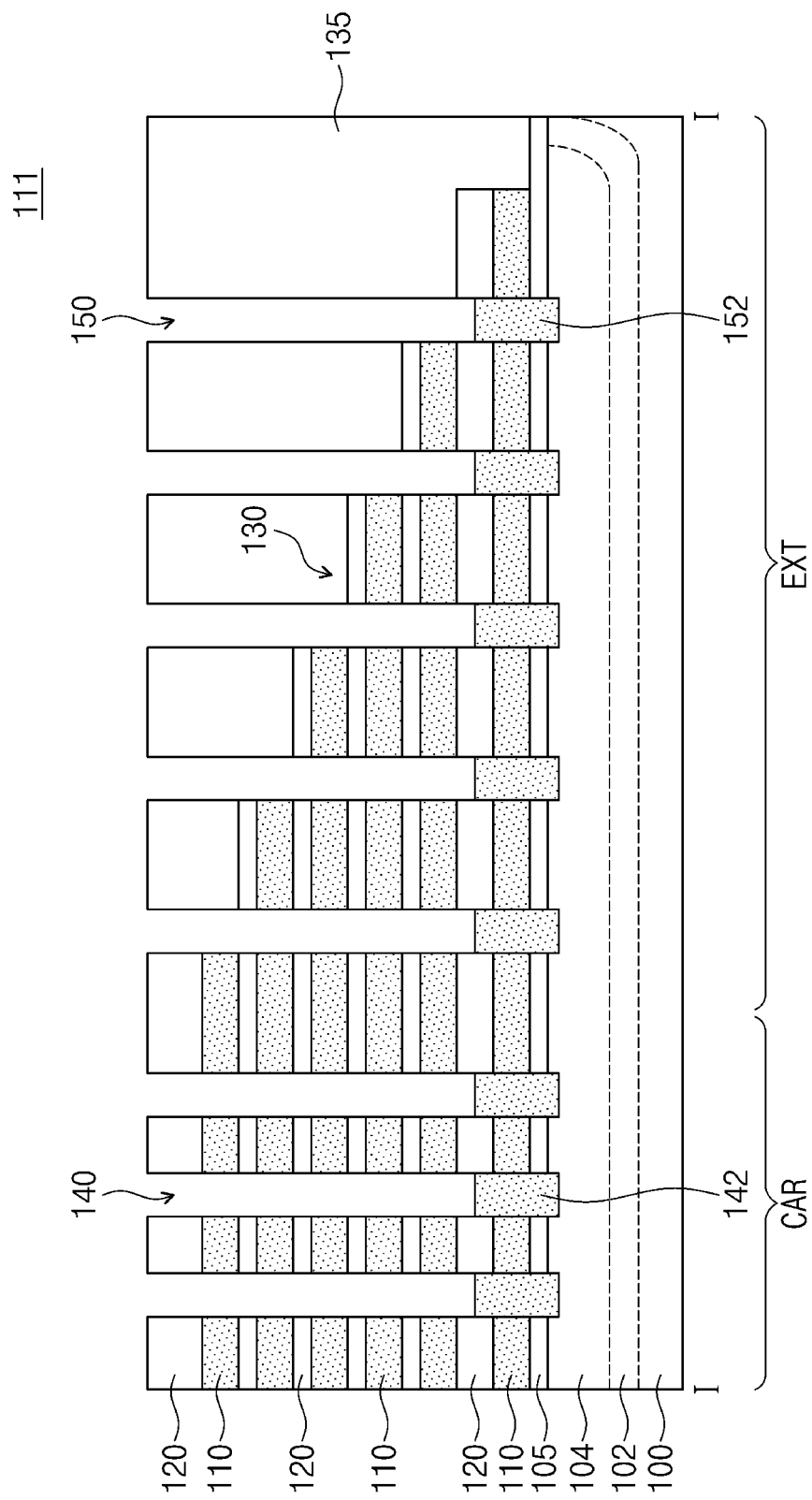
Figure 7B:
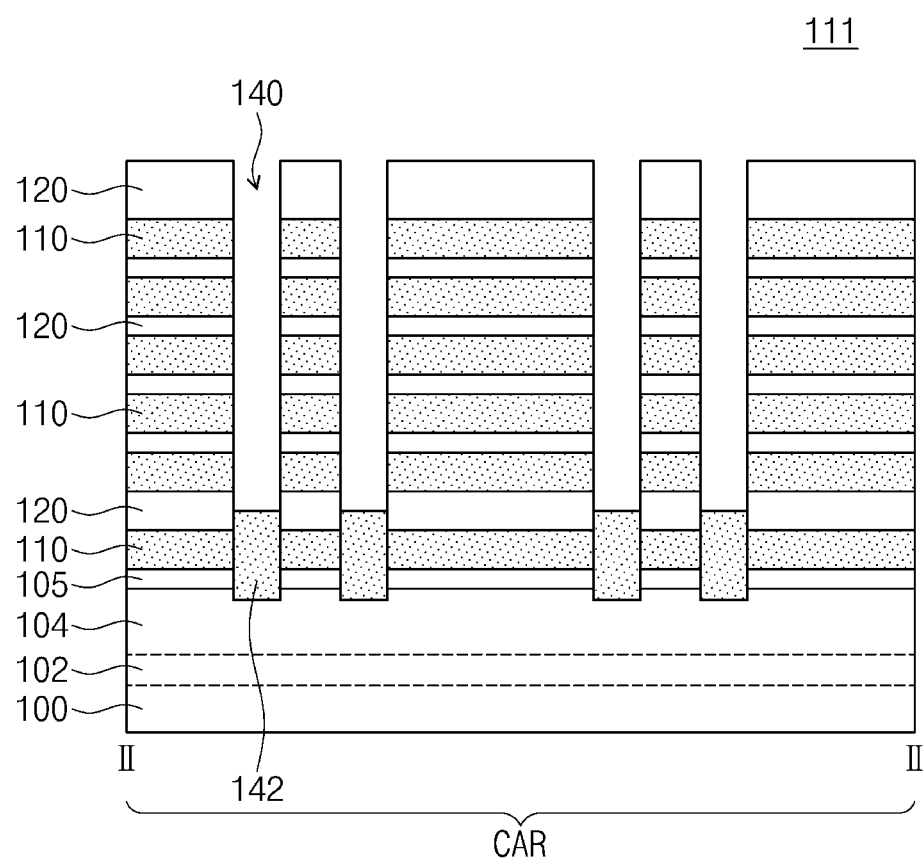
Figure 7C:
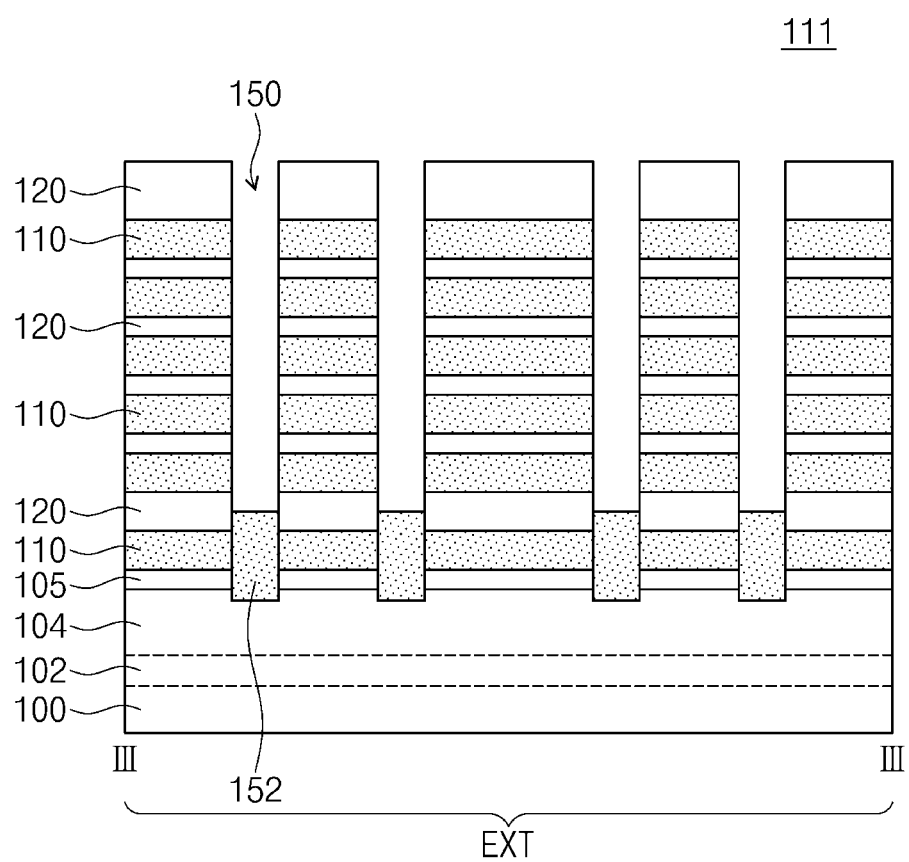

Referring to FIGS. 7A, 7B, and 7C, an insulative planarization layer 135 may be formed to cover the stepwise structure 130, and an etching process may be performed on the mold structure 111 to form a plurality of vertical holes 140 and a plurality of dummy vertical holes 150. The vertical holes 140 may be formed on the cell array region CAR, and the dummy vertical holes 150 may be formed on the extension region EXT. When the etching process is performed, the semiconductor substrate 100 may be overetched to cause the vertical holes 140 and the dummy vertical holes 150 to expand into the pocket well 104. For example, bottom surfaces of the vertical holes 140 and the dummy vertical holes 150 may be at a lower vertical level than a top surface of the pocket well 104.

A selective epitaxial growth (SEG) process may be performed to form a lower channel 142 that partially fills each of the vertical holes 140 and a dummy lower channel 152 that partially fills each of the dummy vertical holes 150. The lower channel 142 and the dummy lower channel 152 may extend into the pocket well 104. For example, bottom surfaces of the lower channel 142 and the dummy lower channel 152 may be at a lower vertical level than a top surface of the pocket well 104. Optionally, a channel doping may be performed to implant the second conductivity impurities (e.g., B or BH$_3$) into the lower channel 142, such that the cell array region CAR and the extension region EXT may be controlled to have different threshold voltages from each other. For example, the threshold voltage of the cell array region CAR may be controlled be greater than that of the extension region EXT. Alternatively, no channel doping may be performed for controlling the threshold voltage.

According to some embodiments, one or more of the substrate doping discussed in FIGS. 6A to 6C and the channel doping discussed in FIGS. 7A to 7C may be carried out to control the threshold voltage. For example, both the substrate doping and the channel doping may be performed (see FIG. 3A). Alternatively, the substrate doping may be carried out, and the channel doping may not be carried out (see FIG. 3B). As another alternative, the substrate doping may not be carried out, and the channel doping may be carried out (see FIG. 3C). The substrate doping and the channel doping may be carried out on the cell array region CAR, not on the extension region EXT (see FIG. 3D).

Figure 8A:
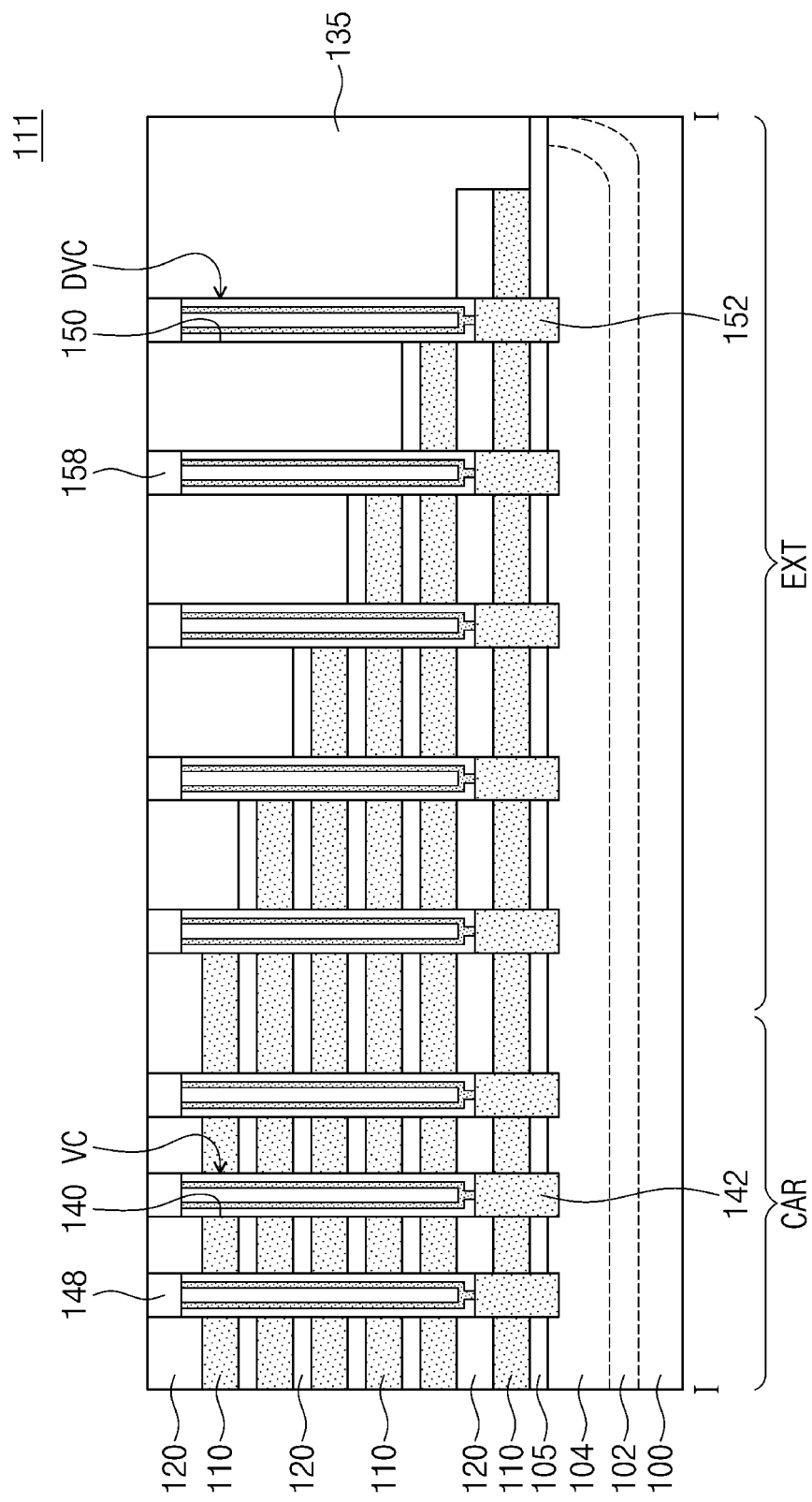
Figure 8B:
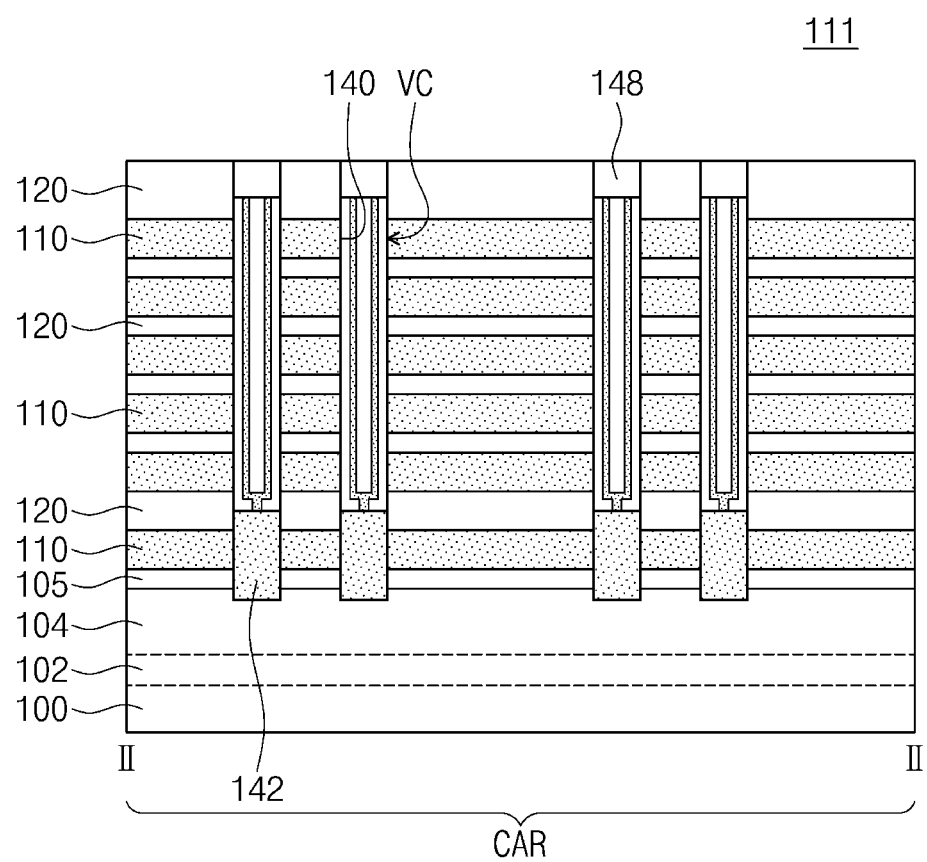
Figure 8C:
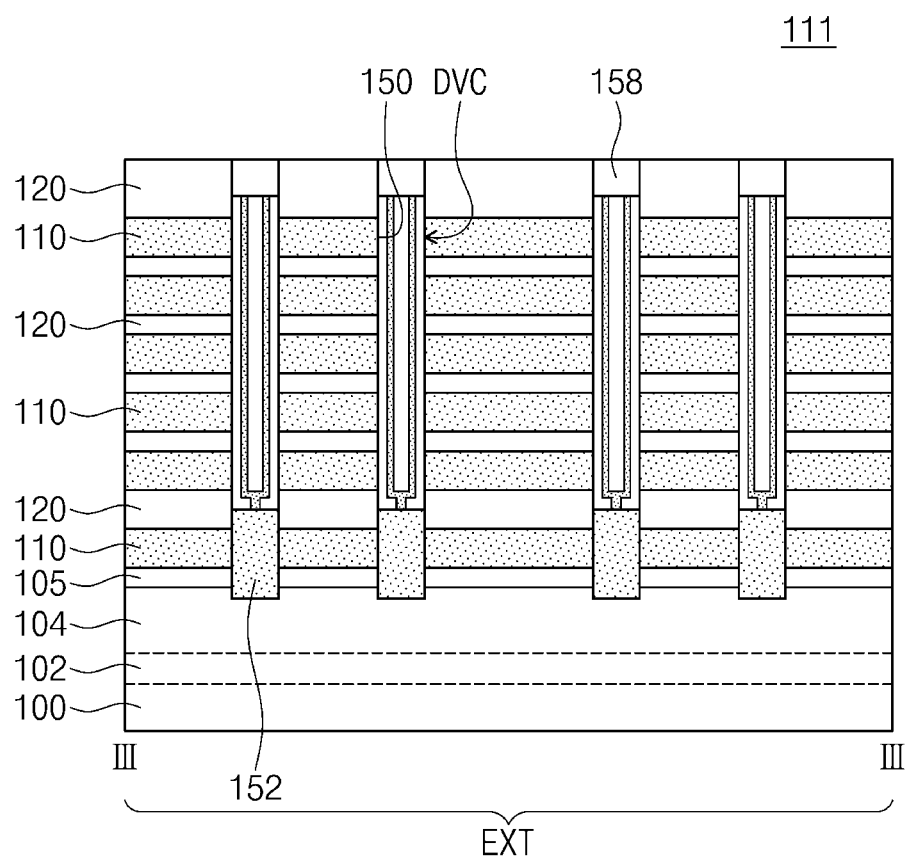

Referring to FIGS. 8A, 8B, and 8C, vertical channels VC may be formed in the vertical holes 140, and the dummy vertical channels DVC may be formed in the dummy vertical holes 150. The vertical channels VC may have a structure as discussed above with reference to FIG. 3A, and the dummy vertical channels DVC may have a structure as discussed above with reference to FIG. 3D. A pad 148 may be formed on a top end of each of the vertical channels VC, and a dummy pad 158 may be formed on a top end of each of the dummy vertical channels DVC. The pad 148 and the dummy pad 158 may include either a conductive material or an impurity-doped region. Alternatively, when the vertical holes 140 are formed to have a U shape, the vertical channels VC may have a U shape or a pipe shape as illustrated in FIG. 2D.

Figure 9A:
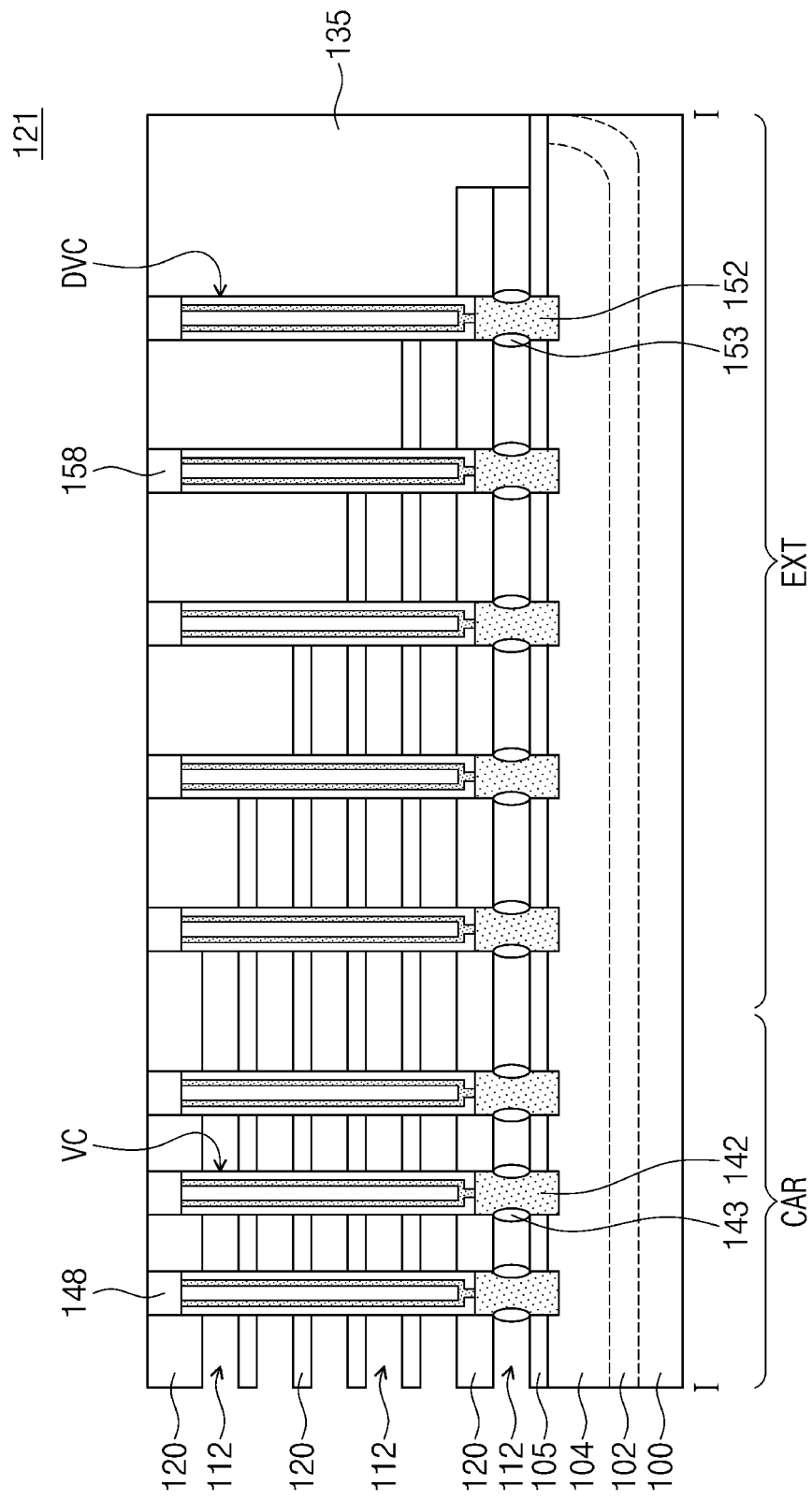
Figure 9B:
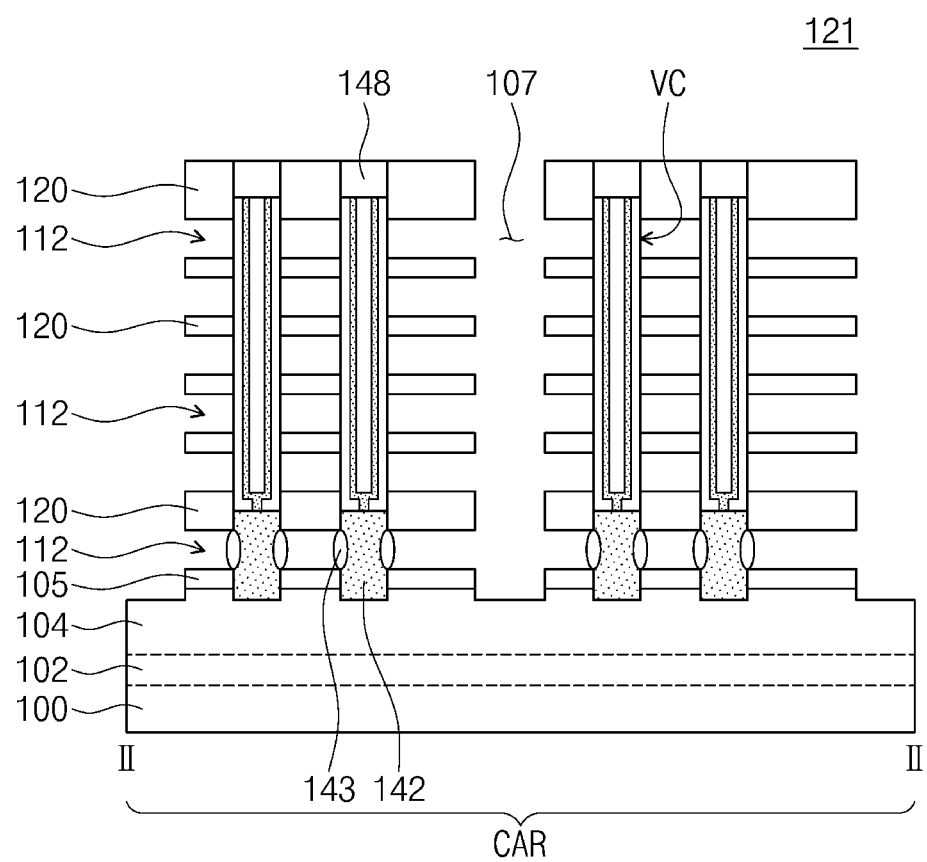
Figure 9C:
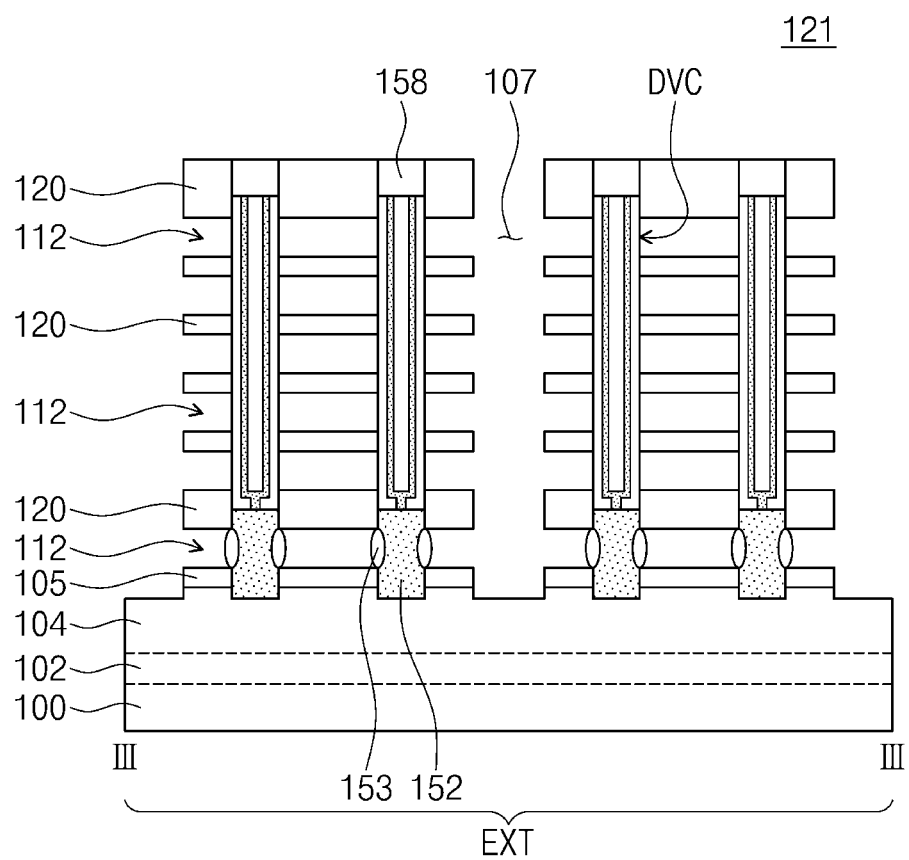

Referring to FIGS. 9A, 9B, and 9C, the mold structure 111 may be patterned to form trenches 107 exposing the pocket well 104. When the mold structure 111 is patterned, the semiconductor substrate 100 may be over-etched to cause the trenches 107 to expand into the pocket well 104. An etchant (e.g., a phosphoric acid) may be provided through the trenches 107, selectively removing the sacrificial layers 110. The selective removal of the sacrificial layers 110 may form a mold wing 121 provided with spaces 112 between the insulation layers 120. A sidewall of each of the lower channels 142 exposed to the spaces 112 may be oxidized or may experience a deposition process, either of which may form a gate dielectric layer 143. Similarly, a sidewall of each of the dummy lower channels 152 exposed to the spaces 112 may be oxidized or may experience a deposition process, either of which may form a dummy gate dielectric layer 153.

Figure 10A:
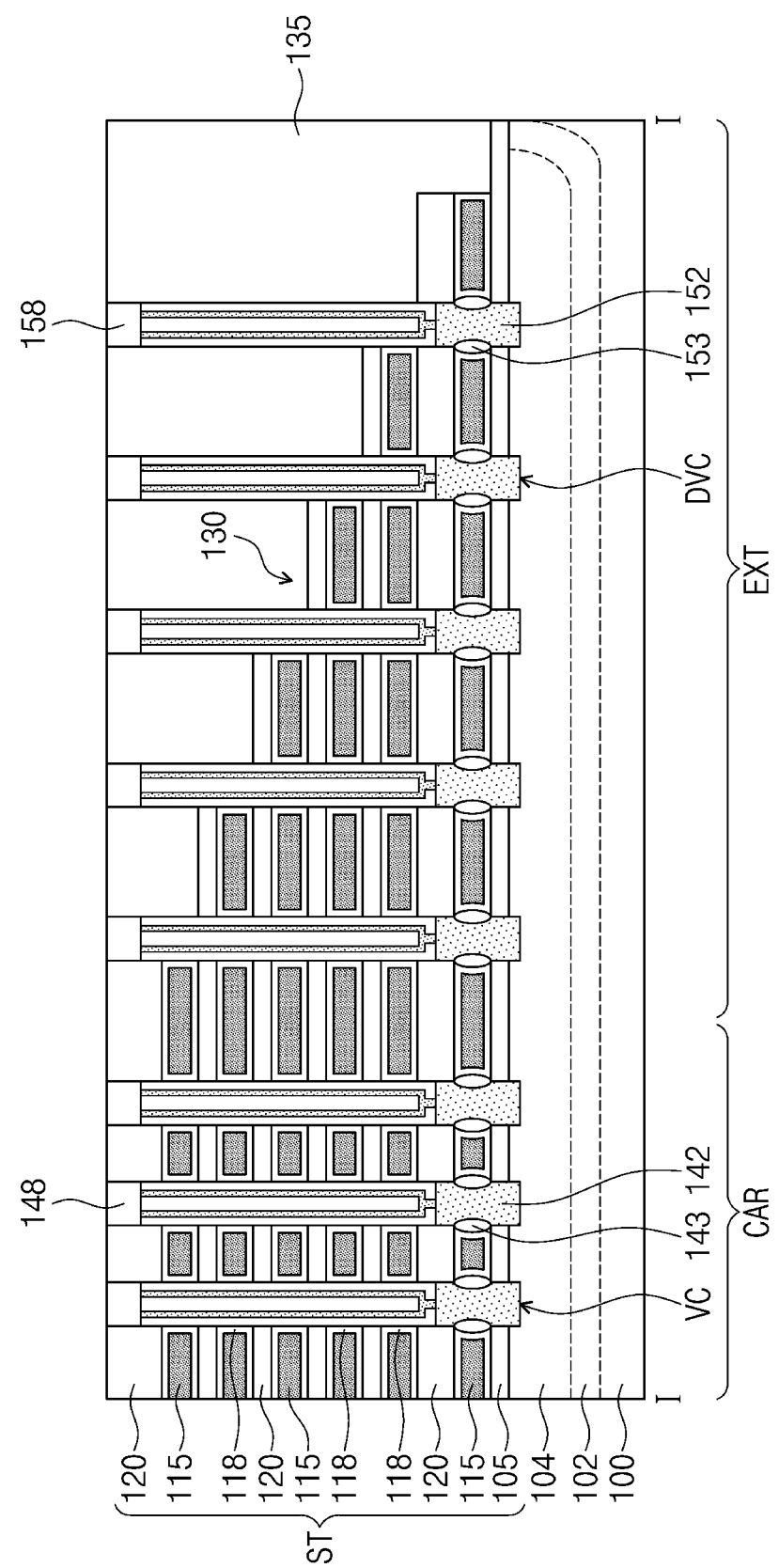
Figure 10B:
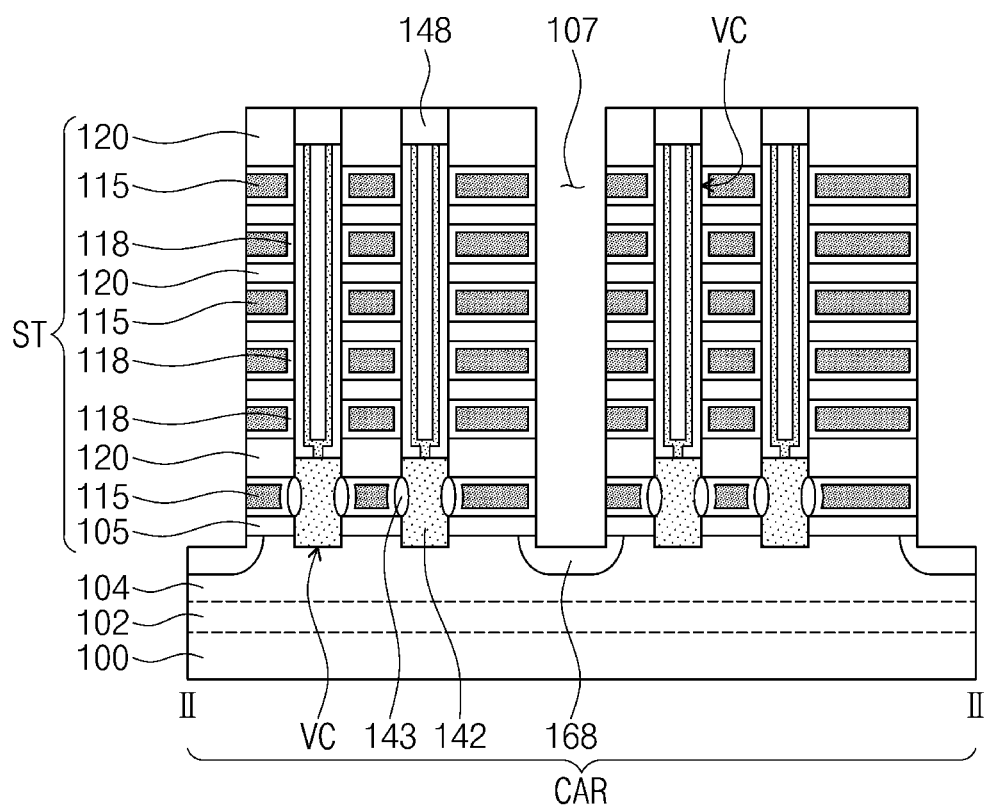
Figure 10C:
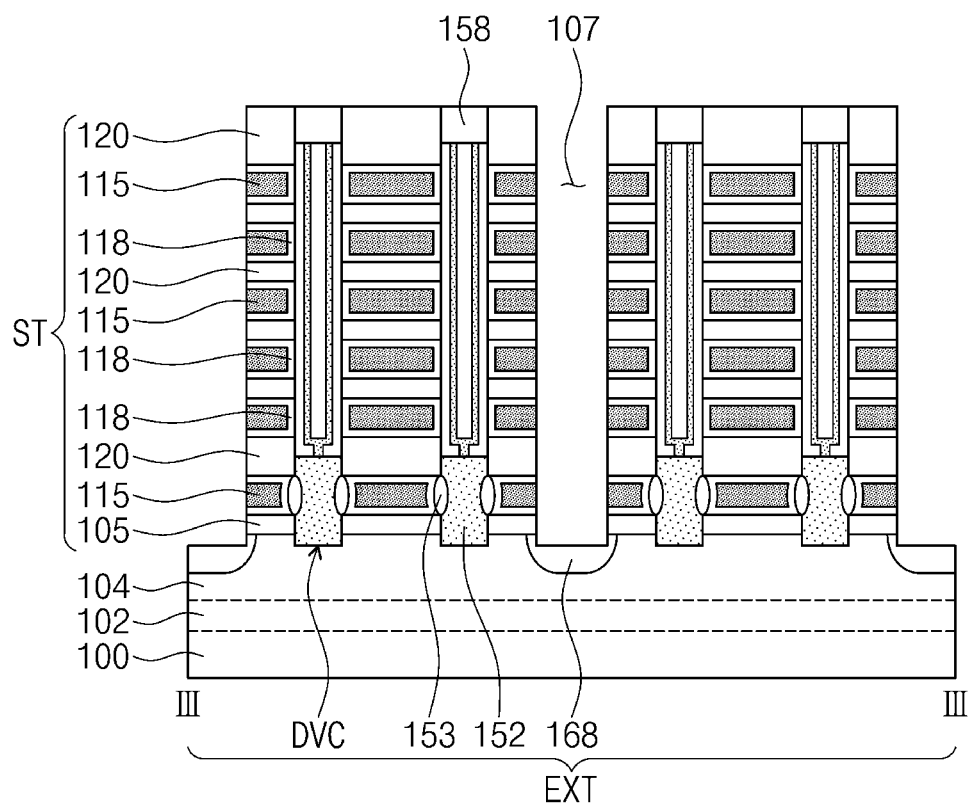

Referring to FIGS. 10A, 10B, and 10C, insulation layers 118 and electrodes 115 may be formed in the spaces 112. The formation of the electrodes 115 may include forming the insulation layers 118, depositing a conductive material on the semiconductor substrate 100, and then patterning the conductive material. Thus, the semiconductor substrate 100 may be provided thereon with a plurality of stack structures ST including a plurality of the electrodes 115 and a plurality of the insulation layers 120 that are alternately and repeatedly stacked. Each of the stack structures ST may include the stepwise structure 130 on the extension region EXT.

The pocket well 104 exposed to the trenches 107 may be doped with impurities having the second conductivity (e.g., N-type conductivity), which may form common sources 168. Alternatively, as discussed with reference to FIGS. 6A, 6B, and 6C, when the second pocket well (see, e.g., second pocket well 106 of FIG. 4A) is formed in the pocket well 104 on the extension region EXT, the doping process for forming the common sources 168 may be differently performed. For example, as illustrated in FIGS. 4A, 4B, 5A, and 5B, the common sources 168 on the cell array region CAR may be doped with impurities having the second conductivity (e.g., N-type conductivity), and the common sources 168 on the extension region EXT may be doped with impurities having the first conductivity (e.g., P-type conductivity).

Figure 11A:
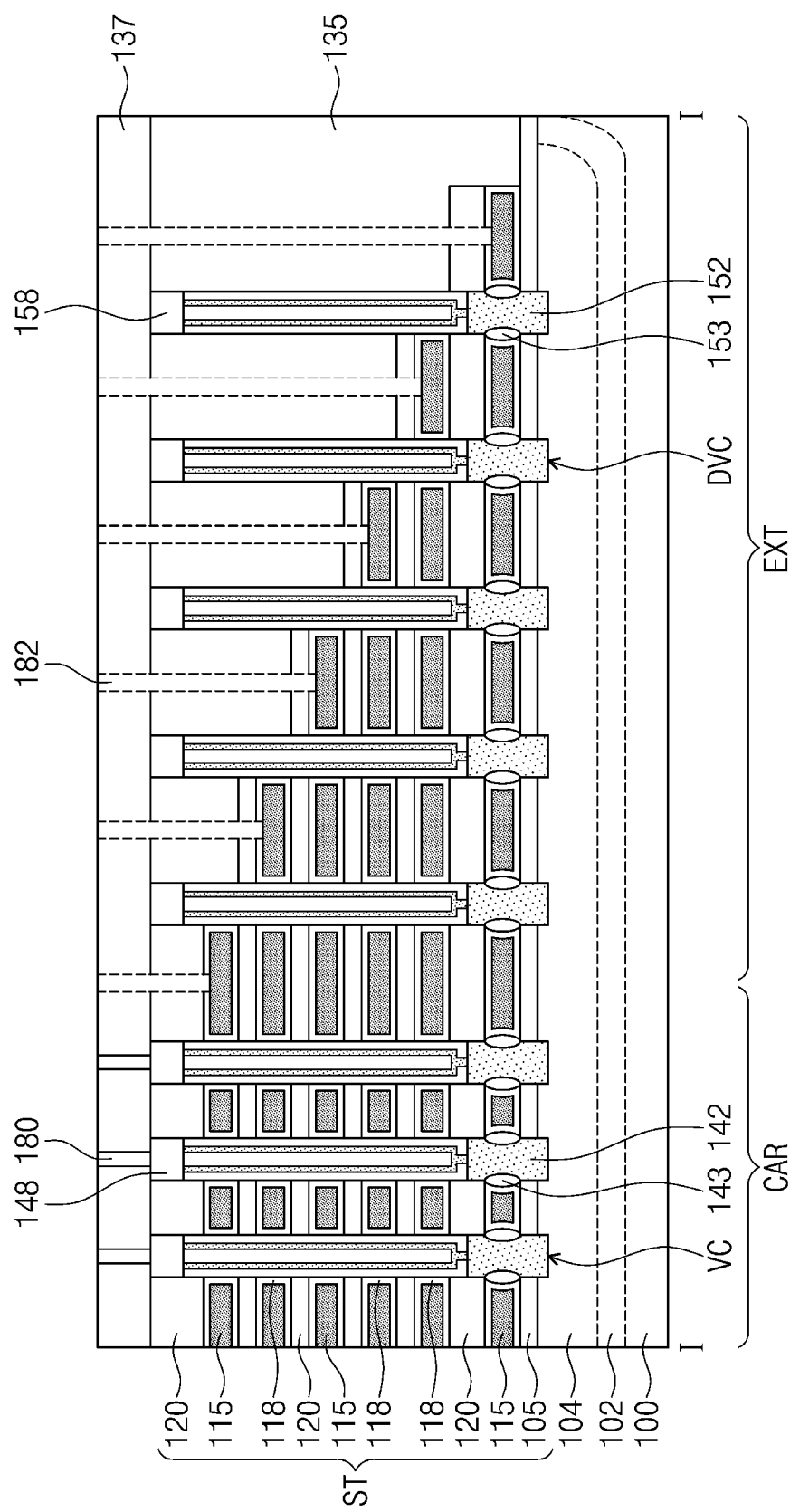
Figure 11B:
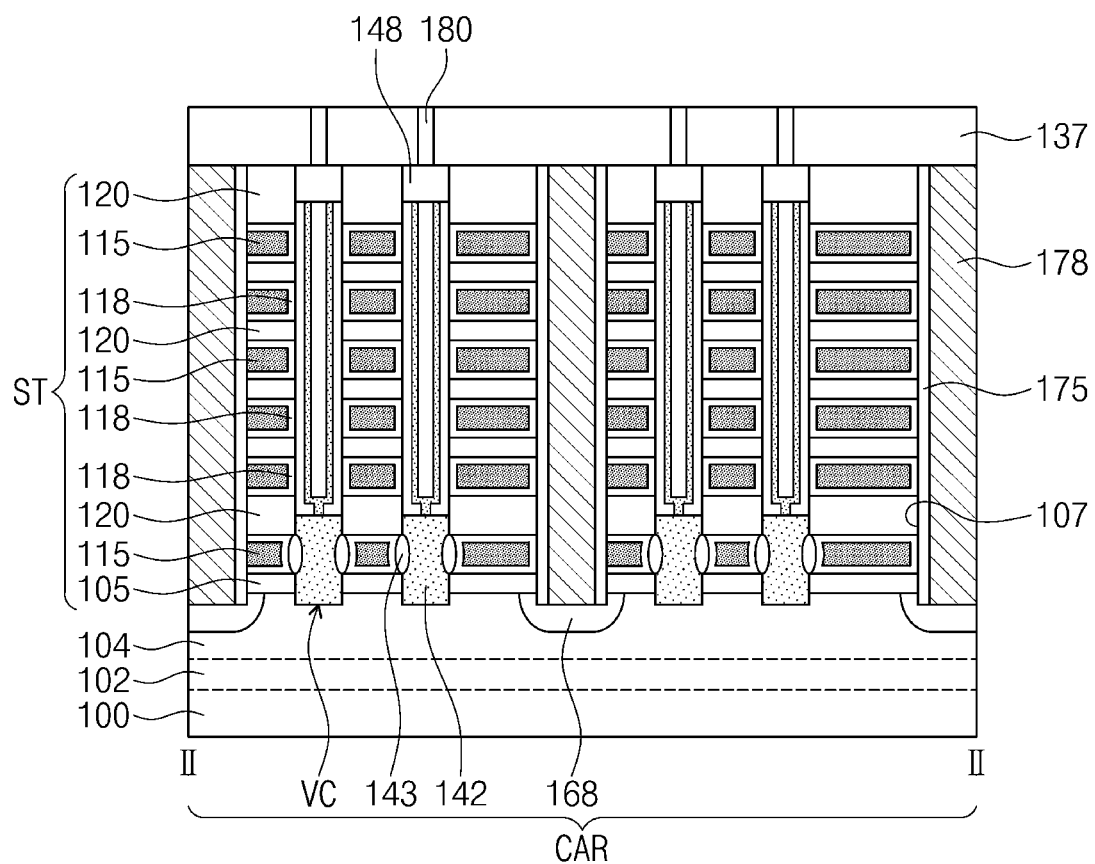
Figure 11C:
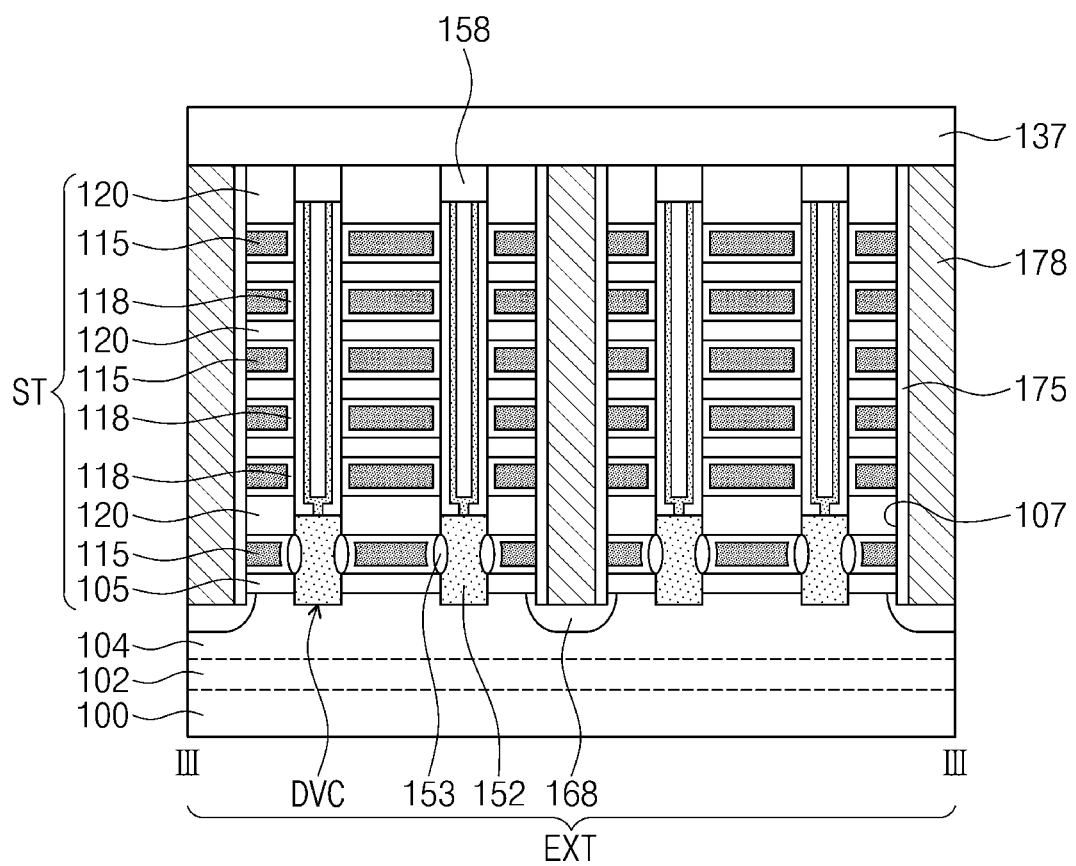

Referring to FIGS. 11A, 11B, and 11C, insulation spacers 175 may be formed in the trenches 107, and common source plugs 178 may be formed to penetrate the insulation spacers 175 to come into electrical connection with the common sources 168. For example, insulation spacers 175 may be provided on sidewalls of the trenches 107, and common source plugs 178 may be formed between the insulation spacers 175. An interlayer dielectric layer 137 may be formed to cover the stack structures ST and the planarization layer 135, and bit line contacts 180 may be formed to penetrate the interlayer dielectric layer 137 to come into contact with the pads 148. The bit line contacts 180 may be formed on the cell array region CAR. Metal contacts 182 may be formed on the extension region EXT that penetrate the interlayer dielectric layer 137 and the planarization layer 135 to come into electrical connection with the electrodes 115. The metal contacts 182 may further penetrate the insulation layers 120 and 118 to come into contact with ends of the electrodes 115.

Figure 12A:
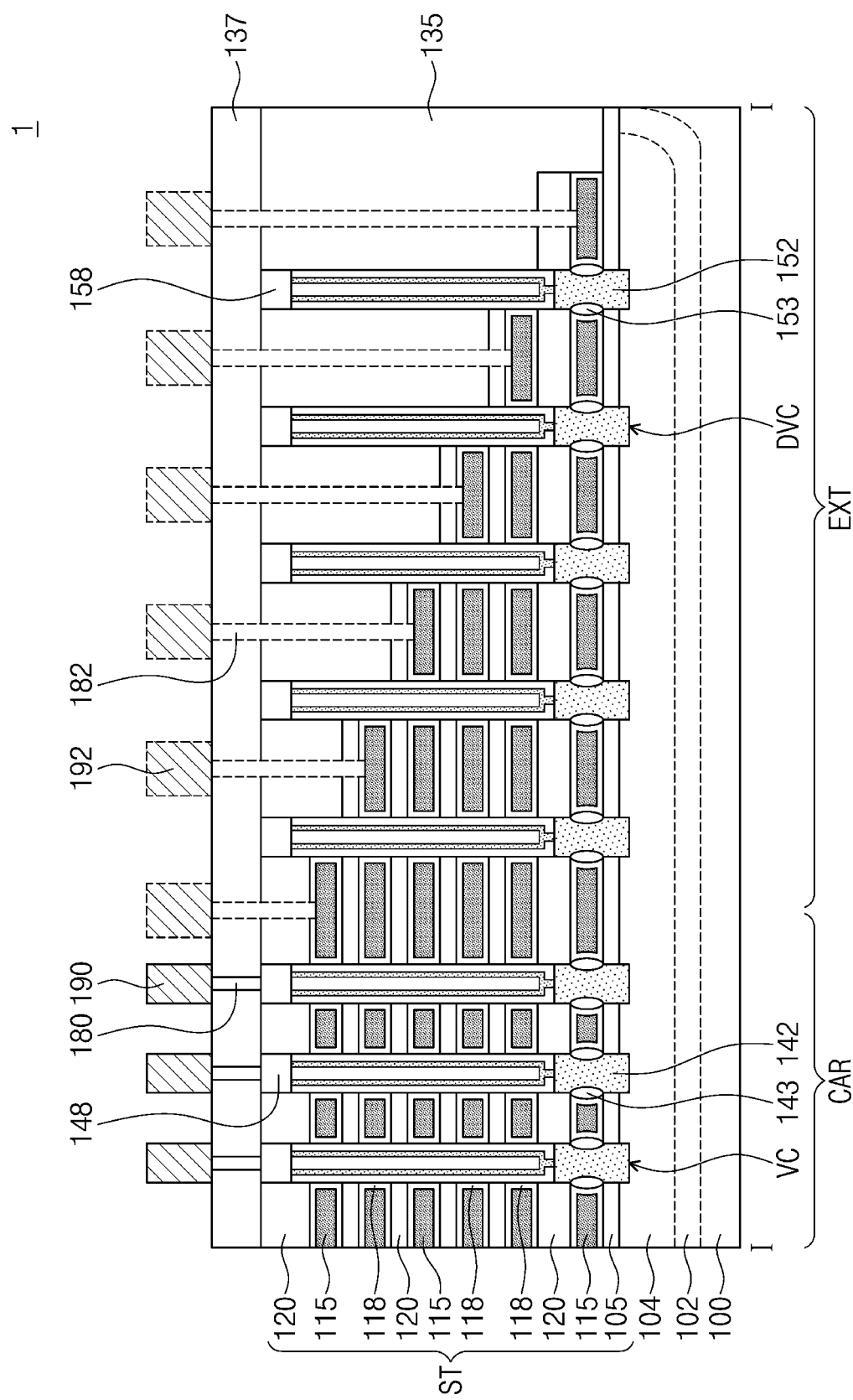
Figure 12B:
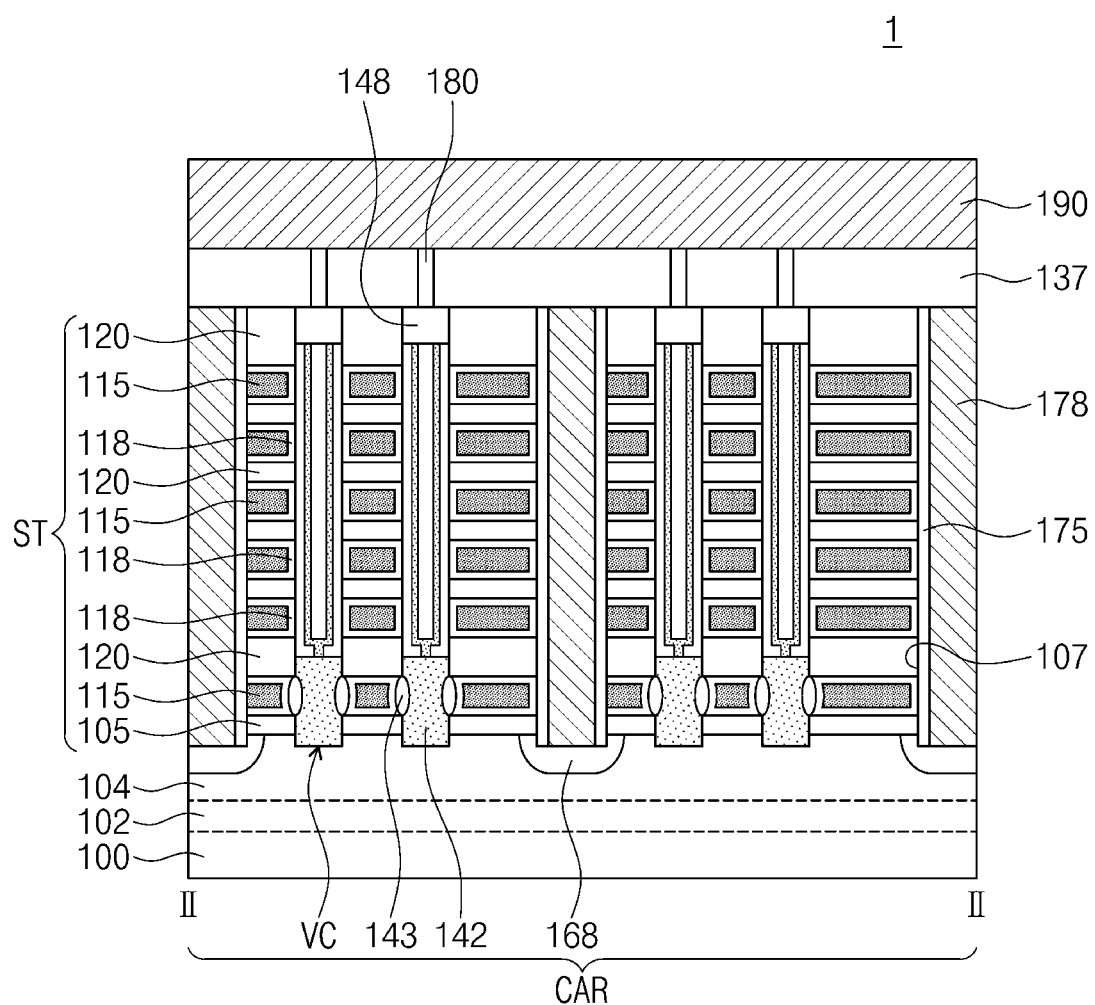
Figure 12C:
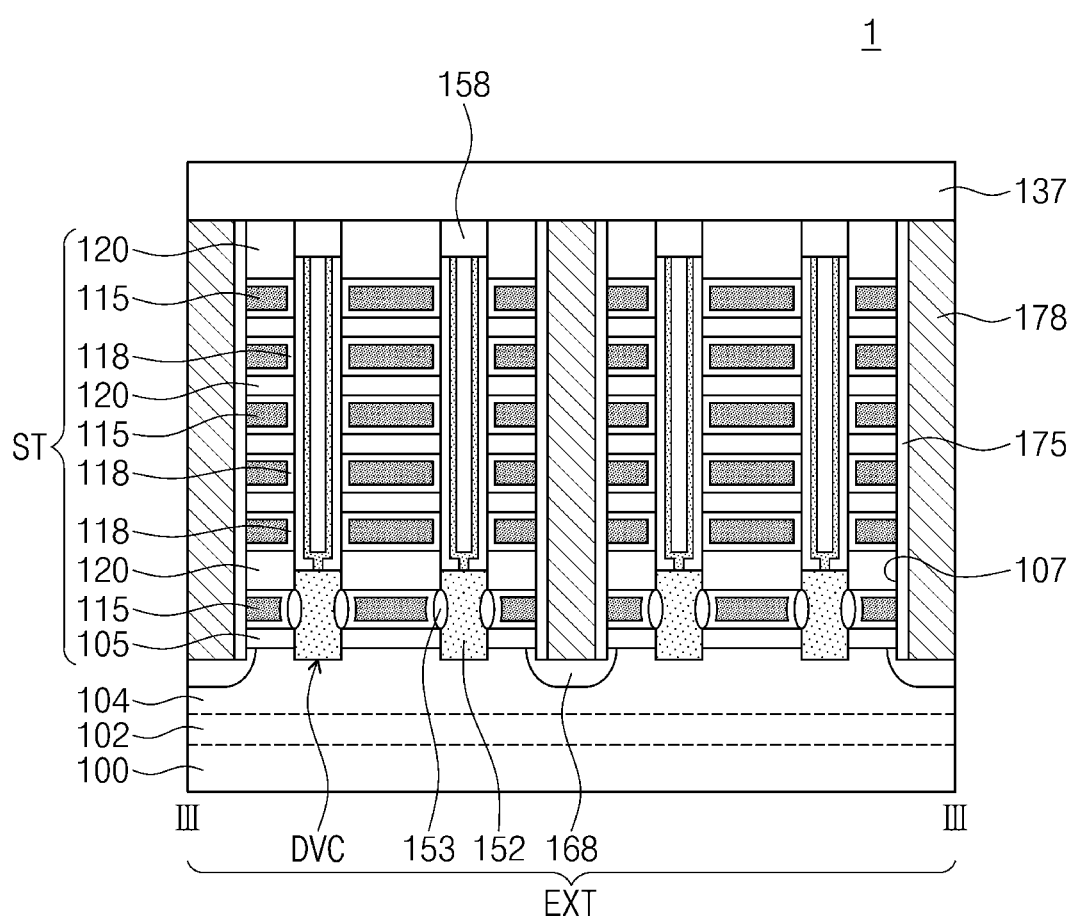

Referring to FIGS. 12A, 12B, and 12C, bit lines 190 and metal lines 192 may be formed on the interlayer dielectric layer 137. The bit lines 190 may be coupled to the bit line contacts 180, thereby electrically connecting the bit lines 190 to corresponding bit line contacts 180, and the metal lines 192 may be coupled to the metal contacts 182 thereby electrically connecting the metal lines 192 to corresponding metal contacts 182. The bit lines 190 may be formed on the cell array region CAR, and the metal lines 192 may be formed on the extension region EXT. Through the processes above, a three-dimensional semiconductor memory device 1 may be manufactured as illustrated in FIG. 1.

According to certain embodiments, the difference in threshold voltage between the ground selection transistor on the cell array region and the dummy ground selection transistor on the extension region may be beneficial to promptly determine the occurrence location of an electrical failure, such as leakage current. Accordingly, the three-dimensional semiconductor memory device may increase manufacturing yield by controlling or changing process recipes on the electrical failure location.

This detailed description of inventive concepts should not be construed as limited to the embodiments set forth herein, and it is intended that inventive concepts cover the various combinations, the modifications and variations of this invention without departing from the spirit and scope of inventive concepts. The appended claims should be construed to include other embodiments.

What is claimed is:

1. A three-dimensional semiconductor memory device, comprising:
    a substrate of a first conductivity, the substrate including a cell array region and an extension region;
    a stack structure on the substrate, the stack structure including a plurality of electrodes vertically stacked on the substrate;
    a vertical channel penetrating the stack structure on the cell array region; and
    a dummy vertical channel penetrating the stack structure on the extension region,
    wherein the substrate comprises:
    a pocket well having the first conductivity and provided with the stack structure thereon;
    a deep well surrounding the pocket well and having a second conductivity opposite to the first conductivity; and
    a doped region having the second conductivity in the pocket well and being adjacent to a bottom surface of the stack structure,
    wherein the vertical channel is disposed on the doped region,
    wherein the dummy vertical channel is disposed on the pocket well and is separated from the doped region, and
    wherein bottom surfaces of the vertical channel and the dummy vertical channel are at a lower vertical level than a top surface of the substrate.

2. The device of claim 1,
    wherein the stack structure comprise a ground select electrode adjacent to the pocket well,
    wherein the ground select electrode combined with the vertical channel constitute a ground selection transistor on the cell array region and the ground select electrode combined with the dummy vertical channel constitute a dummy ground selection transistor on the extension region, and wherein the ground selection transistor has a first threshold voltage on the cell array region and the dummy ground selection transistor has a second threshold voltage on the extension region, and the first threshold voltage is greater than the second threshold voltage.

3. The device of claim 1, wherein a portion of the vertical channel is doped with impurities having the second conductivity, the portion of the vertical channel is adjacent to the pocket well.

4. The device of claim 1, wherein the dummy vertical channel is not doped with impurities having the second conductivity.

5. The device of claim 1, further comprising:
a memory layer between the vertical channel and the stack structure; and
a dummy memory layer between the dummy vertical channel and the stack structure.

6. The device of claim 1,
wherein the stack structure includes a first portion on the cell array region and a second portion having a stepwise structure on the extension region, and
wherein the dummy vertical channel penetrates the stepwise structure.

7. The device of claim 1,
wherein the vertical channel comprises a lower channel on the pocket well and an upper channel on the lower channel, and
wherein the dummy vertical channel comprises a dummy lower channel on the pocket well and a dummy upper channel on the dummy lower channel.

8. A three-dimensional semiconductor memory device, comprising:
a substrate of a first conductivity, the substrate including a cell array region and an extension region;
a stack structure on the substrate, the stack structure including a plurality of electrodes vertically stacked on the substrate;
a vertical channel penetrating the stack structure on the cell array region, the vertical channel comprising a lower channel on a pocket well and an upper channel on the lower channel;
a dummy vertical channel penetrating the stack structure on the extension region, the dummy vertical channel comprising a dummy lower channel on the pocket well and dummy upper channel on the dummy lower channel,
wherein the substrate comprises:
a pocket well having the first conductivity and provided with the stack structure thereon; and
a deep well surrounding the pocket well and having a second conductivity opposite to the first conductivity,
wherein the lower channel is doped with impurities having the second conductivity, and
wherein the dummy lower channel is not doped with impurities having the second conductivity.

9. The device of claim 8, wherein the pocket well includes a doped region on the cell array region doped with impurities having the second conductivity.

10. The device of claim 9, wherein the dummy vertical channel is spaced apart from the doped region.

11. The device of claim 8, wherein the plurality of electrodes comprise:
a ground select electrode extending from the cell array region toward the extension region, the ground select electrode combined with the vertical channel to constitute a ground selection transistor on the cell array region and combined with the dummy vertical channel to constitute a dummy ground selection transistor on the extension region;
one or more memory electrodes stacked on the ground select electrode; and
a string select electrode on the one or more memory electrodes,
wherein the ground selection transistor has a first threshold voltage on the cell array region and the dummy ground selection transistor has a second threshold voltage on the extension region, and the first threshold voltage is greater than the second threshold voltage.

12. The device of claim 8, further comprising:
a memory layer between the upper channel and the stack structure; and
a dummy memory layer between the dummy upper channel and the stack structure.

13. The device of claim 8, wherein a bottom surface of the vertical channel is at a lower vertical level than a top surface of the substrate.

14. A three-dimensional semiconductor memory device, comprising:
a substrate of a first conductivity, the substrate including a cell array region and an extension region;
a stack structure on the substrate, the stack structure including a plurality of electrodes vertically stacked on the substrate;
a vertical channel penetrating the stack structure on the cell array region; and
a dummy vertical channel penetrating the stack structure on the extension region,
wherein the stack structure including a first portion on the cell array region and a second portion having a stepwise structure on the extension region;
wherein the substrate comprises:
a pocket well having the first conductivity and provided with the stack structure thereon; and
a deep well surrounding the pocket well and having a second conductivity opposite to the first conductivity,
wherein the pocket well having a first region overlapped with the first portion of the stack structure and a second region overlapped with the second portion of the stack structure, and
wherein the first and second regions have impurities of the first conductivity, an impurity concentration of the first region is lower than that of the second region.

15. The device of claim 14,
wherein the stack structure comprise a ground select electrode adjacent to the pocket well,
wherein the ground select electrode combined with the vertical channel constitute a ground selection transistor on the cell array region and the ground select electrode combined with the dummy vertical channel constitute a dummy ground selection transistor on the extension region, and
wherein the ground selection transistor has a first threshold voltage on the cell array region and the dummy ground selection transistor has a second threshold voltage on the extension region and the first threshold voltage being greater than the second threshold voltage.

16. The device of claim 14,
wherein the vertical channel comprises a lower channel on the pocket well and an upper channel on the lower channel, and
wherein the dummy vertical channel comprises a dummy lower channel on the pocket well and an dummy upper channel on the dummy lower channel.

17. The device of claim 14, further comprising:
a memory layer between the vertical channel and the stack structure; and
a dummy memory layer between the dummy vertical channel and the stack structure.

18. The device of claim 14, wherein bottom surfaces of the vertical channel and the dummy vertical channel are at a lower vertical level than a top surface of the substrate.

\* \* \* \* \*